United States Patent
Hong et al.

(10) Patent No.: US 11,870,399 B2
(45) Date of Patent: Jan. 9, 2024

(54) RECEIVER FOR CANCELLING COMMON MODE OFFSET AND CROSSTALK

(71) Applicant: Samsung Electronics Co., Ltd., Suwon-si (KR)

(72) Inventors: Seunghwan Hong, Hwaseong-si (KR); Youngsoo Sohn, Seoul (KR); Jeongdon Ihm, Seongnam-si (KR); Changhyun Bae, Hwaseong-si (KR); Yoochang Sung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 376 days.

(21) Appl. No.: 17/227,996

(22) Filed: Apr. 12, 2021

(65) Prior Publication Data

US 2021/0408970 A1 Dec. 30, 2021

(30) Foreign Application Priority Data

Jun. 26, 2020 (KR) .......................... 10-2020-0078802

(51) Int. Cl.
    *H03F 1/26*       (2006.01)
    *H03F 3/19*       (2006.01)

(52) U.S. Cl.
    CPC ................. *H03F 1/26* (2013.01); *H03F 3/19* (2013.01); *H03F 2200/375* (2013.01)

(58) Field of Classification Search
    CPC ........ H03F 1/26; H03F 3/19; H03F 2200/375; H03F 3/45744; H03F 3/45183;

(Continued)

(56) References Cited

U.S. PATENT DOCUMENTS 6,289,063 B1    9/2001    Duxbury
7,826,568 B2    11/2010    Sommer et al.
(Continued)

FOREIGN PATENT DOCUMENTS

CN      108270464 A      7/2018
EP      3468124 A1      4/2019
(Continued)

OTHER PUBLICATIONS

Notice of Allowance dated Apr. 25, 2022, issued in corresponding Taiwanese Patent Application No. 110122357.

*Primary Examiner* — Andrea Lindgren Baltzell
*Assistant Examiner* — Khiem D Nguyen
(74) *Attorney, Agent, or Firm* — Harness, Dickey & Pierce, P.L.C.

(57) ABSTRACT

A receiver for cancelling common mode offset and crosstalk that amplifies a voltage difference between an input signal and a reference voltage to generate first and second output signals and an internal signal, that generates the same third and fourth output signals as the first and second output signals, generates average voltage levels of the third and fourth output signals by using first and second switching elements and low pass filters to output the average voltage levels as first and second feedback signals, and cancels a common mode offset between the first output signal and the second output signal based on a voltage difference between the first feedback signal and the second feedback signal, and that generates a control signal to cancel crosstalk of the internal signal by turning on/off the first and second switching elements connected to the low pass filters.

20 Claims, 12 Drawing Sheets

(58) Field of Classification Search
CPC ...... H03F 3/193; H03K 19/0185; H04B 1/12; H04B 1/1027; H04B 1/16
USPC .......................... 330/51, 291, 258.259, 260
See application file for complete search history.

(56) References Cited

U.S. PATENT DOCUMENTS

| | | |
|---|---|---|
| 7,961,817 B2 | 6/2011 | Dong et al. |
| 8,050,332 B2 | 11/2011 | Chung et al. |
| 8,442,099 B1 | 5/2013 | Sederat |
| 8,472,533 B2 | 6/2013 | Wiese |
| 8,724,678 B2 | 5/2014 | Farjadrad |
| 10,276,521 B2 | 4/2019 | Babcock et al. |
| 2019/0075518 A1 | 3/2019 | Ganton et al. |
| 2020/0313638 A1 | 10/2020 | Hong et al. |

FOREIGN PATENT DOCUMENTS

| | | |
|---|---|---|
| TW | 201914268 A | 4/2019 |
| WO | WO-2010/042350 A1 | 4/2010 |

RECEIVER FOR CANCELLING COMMON MODE OFFSET AND CROSSTALK

CROSS-REFERENCE TO RELATED APPLICATION

This application is based on and claims priority under 35 U.S.C. § 119 to Korean Patent Application No. 10-2020-0078802, filed on Jun. 26, 2020, in the Korean Intellectual Property Office, the disclosure of which is incorporated by reference herein in its entirety.

BACKGROUND

The inventive concepts relate to a receiver, and more particularly, to a receiver circuit for cancelling common mode offset and crosstalk.

A semiconductor device may use a signal swinging to a current mode logic (CML) level for an input/output (I/O) interface for a signal operating at a high speed, for example, a transmitter/receiver. The CML level refers to a predetermined or alternatively, desired direct current (DC) level or an average level determined by a certain criterion. The signal swinging to the CML level is a signal that toggles in an amplitude or swing range based on a DC level called a CML level.

For example, when a power supply voltage (hereinafter, referred to as VDD) level of a semiconductor device is about 1.2 volts (V) and a ground voltage (hereinafter, referred to as VSS) level is 0 V, the CML level of a signal swinging based on the CML level may be about 1.0 V, and the swing width of the signal may be about 0.5 V. A CML level signal has a relatively small swing width compared to a complementary metal oxide semiconductor (CMOS) level, which is a digital signal level of internal signals of a semiconductor device. A CMOS level signal full swings from the VDD level to the VSS level. Because the swing width of the CML level signal is less than that of the CMOS level signal, the CML level signal may operate with a relatively low power supply and may operate with high-speed switching.

The transmitter/receiver may transmit and receive signals by using single-ended signaling or differential signaling. The single-ended signaling requires one signal line per signal, and differential signaling requires two signal lines per signal. Because the number of signal pins and signal lines required to implement the single-ended signaling is less than the number of signal pins and signal lines required to implement the differential signaling, a circuit using a single-ended signaling method occupies a small area in a semiconductor device.

However, in the single-ended signaling method, when several single-ended ports of a transmitter simultaneously switch in the same direction, noise (e.g., simultaneous switching output induced noise (SSN)) may be induced by current flowing through a parasitic inductor, and thus, the jitter of an output driver may increase and the input voltage margin of a receiver may decrease due to reflection noise. In addition, the single-ended signaling method may be affected by the transition of adjacent signal lines, and thus, crosstalk may occur due to an instantaneous change in a transition position, and high-frequency components of signals may be attenuated by low pass filter characteristics of signal lines. In addition, inter-symbol interference (ISI) distortion in which a state of a previous signal affects the timing of a current signal may occur due to a propagation delay.

When a receiver, especially a single-ended signaling receiver with a bad signal line environment such as interference distortion, reflection noise, and/or crosstalk, receives an input signal having a CML level, the sensing margin of the receiver may decrease. Nevertheless, the receiver has to be able to accurately determine a logic level of the input signal according to a small swing width voltage level of the input signal. Accordingly, data invariance may be maintained when the input signal having a CML level is converted into a digital signal having a CMOS level.

SUMMARY

The inventive concepts provide a receiver that cancels common mode offset and crosstalk to maintain data invariance.

According to an aspect of the inventive concepts, there is provided a receiver including: a first circuit configured to receive an input signal, amplify a voltage difference between a voltage level of the input signal and a level of a reference voltage to generate first and second output signals, and output an internal signal, which is a digital signal corresponding to bits of the input signal, based on a voltage difference between the first output signal and the second output signal; a second circuit configured to receive the input signal, amplify the voltage difference between the voltage level of the input signal and the level of the reference voltage to generate third and fourth output signals, generate an average voltage level of the third output signal through a first switching element responsive to a control signal to output the average voltage level of the third output signal as a first feedback signal, and generate an average voltage level of the fourth output signal through a second switching element responsive to the control signal to output the average voltage level of the fourth output signal as a second feedback signal; and a control circuit configured to output the control signal of a pulse type whenever a logic level of the internal signal transitions, wherein the first and second switching elements are selectively turned on or off according to a logic pulse level of the control signal.

According to another aspect of the inventive concepts, there is provided a receiver including: a first circuit configured to receive an input signal, amplify a voltage difference between a voltage level of the input signal and a level of a reference voltage to generate first and second output signals, and output an internal signal, which is a digital signal corresponding to bits of the input signal, based on a voltage difference between the first output signal and the second output signal; a second circuit configured to receive the input signal, amplify the voltage difference between the voltage level of the input signal and the level of the reference voltage to generate third and fourth output signals, generate an average voltage level of the third output signal through a first switching element responsive to a control signal to output the average voltage level of the third output signal as a first feedback signal, and generate an average voltage level of the fourth output signal through a second switching element responsive to the control signal to output the average voltage level of the fourth output signal as a second feedback signal; and a control circuit configured to output the control signal of a pulse type or the control signal having a fixed logic level whenever a logic level of the internal signal transitions, based on a selection signal.

According to another aspect of the inventive concepts, there is provided a receiver for receiving an input signal and outputting an internal signal that is a digital signal corresponding to bits of the input signal, the receiver including: a first amplifier circuit configured to amplify a voltage difference between a voltage level of the input signal and a level of a reference voltage to output a first output signal to a first node line and output a second output signal to a second node line; a second amplifier circuit configured to amplify a voltage difference between the first output signal and the second output signal to output fifth and sixth output signals, the second amplifier circuit being connected to the first node line and the second node line; a level conversion circuit configured to amplify a first swing width of the fifth and sixth output signals to a second swing width greater than the first swing width and generate the internal signal; a first equalizer circuit configured to receive the input signal, amplify the voltage difference between the voltage level of the input signal and the level of the reference voltage to generate third and fourth output signals, generate an average voltage level of the third output signal through a first switching element responsive to a control signal to output the average voltage level of the third output signal as a first feedback signal, generate an average voltage level of the fourth output signal through a second switching element responsive to the control signal to output the average voltage level of the fourth output signal as a second feedback signal, and adjust the voltage difference between the first output signal and the second output signal based on a voltage difference between the first feedback signal and the second feedback signal; and a control circuit configured to output the control signal of a pulse type whenever a logic level of the internal signal transitions, wherein the first and second switching elements are selectively turned on or off according to a logic pulse level of the control signal.

BRIEF DESCRIPTION OF THE DRAWINGS

Example embodiments of the inventive concepts will be more clearly understood from the following detailed description taken in conjunction with the accompanying drawings.

DETAILED DESCRIPTION OF EXAMPLE EMBODIMENTS

Figure 1:
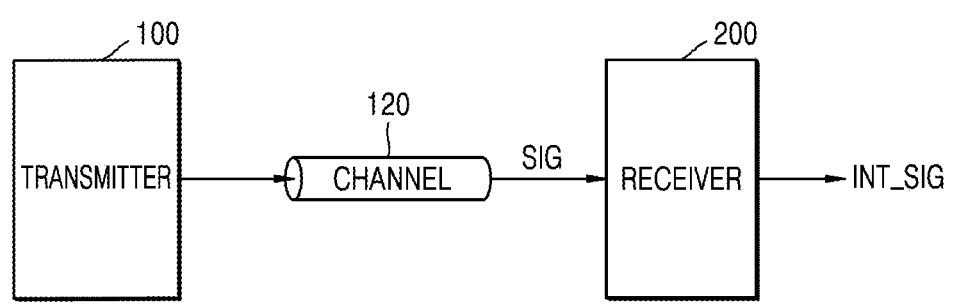
FIG. 1 is a block diagram conceptually illustrating a transmitter and a receiver according to example embodiments of the inventive concepts.

FIG. 1 is a block diagram conceptually illustrating a transmitter 100 and a receiver 200 according to example embodiments of the inventive concepts.

Referring to FIG. 1, the receiver 200 may receive an input signal SIG from the transmitter 100 through a channel 120.

The channel 120 may be a signal line that physically or electrically connects the transmitter 100 to the receiver 200. The channel 120 may be coupled to pins of each of the transmitter 100 and the receiver 200 at ends of the channel 120. The term "pin" broadly refers to an electrical interconnection to an integrated circuit, and may include, for example, pads or other electrical contacts on the integrated circuit.

The channel 120 may be implemented using, for example, a trace of a printed circuit board (PCB) or a coaxial cable, and may attenuate a high frequency component of the input signal SIG transmitted through the channel 120 due to a skin effect, a dielectric loss, or the like. When the input signal SIG is transmitted through the channel 120, channel loss may occur in the receiver 200. In the channel 120, an impedance mismatch may occur due to connectors and other physical interfaces between boards and cables. The impedance mismatch of the channel 120 may appear as a notch in a frequency response of the channel 120 and may cause reflection noise in the receiver 200. A phenomenon (e.g., inter-symbol interference (ISI)), in which each of the bits of the input signal SIG passing through the channel 120 may interfere with next bit(s) due to channel loss or bandwidth limitation and a bit error rate (BER) increases as adjacent symbols overlap each other, may occur.

The transmitter 100 may transmit the input signal SIG by using a single-ended signaling method. The transmitter 100 may transmit an input signal SIG including serialized bits to the receiver 200 through the channel 120. The input signal SIG may be transmitted as a bit signal having a current mode logic (CML) level. The receiver 200 may receive the input signal SIG transmitted through the channel 120. The receiver 200 may receive an input signal SIG having a CML level, determine bits of the input signal SIG, and output an internal signal INT_SIG. The internal signal INT_SIG may be output at a CMOS level that is a digital signal level. That is, the receiver 200 may convert the input signal SIG having a CML level into a signal having a CMOS level and output the signal having a CMOS level as the internal signal INT_SIG. The internal signal INT_SIG may be configured to perform an operation corresponding to a function of the input signal SIG in a semiconductor device including the receiver 200.

When the semiconductor device is implemented as a memory device, the input signal SIG transmitted through the channel 120 may include a command signal, an address signal, and/or a data input/output signal. The receiver 200 may convert the input signal SIG having a CML level, which includes the received command signal, address signal, and/or data input/output signal, into a signal having a CMOS level, and may output the signal having a CMOS level as the internal signal INT_SIG corresponding to the function of the input signal SIG. Memory interfacing such as selecting a row and column corresponding to a memory cell, writing data to a memory cell, or reading written data may be performed by using the internal signal INT_SIG.

Figure 2:
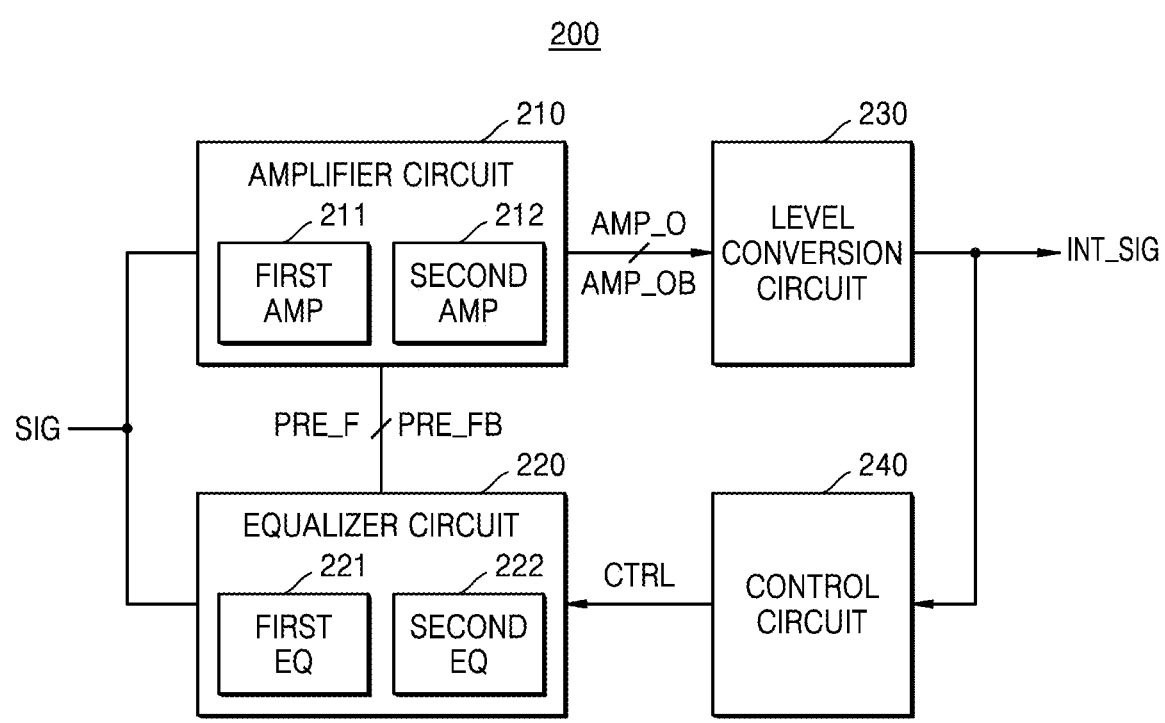
FIG. 2 is a block diagram of a receiver according to example embodiments of the inventive concepts.

FIG. 2 is a block diagram of a receiver 200 according to example embodiments of the inventive concepts.

Referring to FIG. 2, the receiver 200 includes an amplifier circuit 210, an equalizer circuit 220, a level conversion circuit 230, and/or a control circuit 240. The amplifier circuit 210 may be connected to an input signal (SIG) line and may generate first and second output signals PRE_F and PRE_FB and fifth and sixth output signals AMP_O and AMP_OB based on the voltage level of the input signal SIG. The amplifier circuit 210 may include a first amplifier circuit 211 and/or a second amplifier circuit 212. The first amplifier circuit 211 may amplify a voltage difference between the voltage level of the input signal SIG and the level of a reference voltage VREF (see FIG. 3) and generate the first and second output signals PRE_F and PRE_FB, and may provide the generated first and second output signals PRE_F and PRE_FB to the equalizer circuit 220. The second amplifier circuit 212 may amplify a voltage difference between the first output signal PRE_F and the second output signal PRE_FB and generate the fifth and sixth output signals AMP_O and AMP_OB, and may provide the generated fifth and sixth output signals AMP_O and AMP_OB to the level conversion circuit 230.

The equalizer circuit 220 may be connected to the input signal (SIG) line, first and second output signal (PRE_F and PRE_FB) lines, and a control signal (CTRL) line, and may include a first equalizer circuit 221 and/or a second equalizer circuits 222. The first equalizer circuit 221 may amplify a voltage difference between the voltage level of the input signal SIG and the level of the reference voltage REF and generate third and fourth output signals PRE_S and PRE_SB (see FIG. 3) that are the same as the first and second output signals PRE_F and PRE_FB, respectively. The first equalizer circuit 221 may generate average voltage levels of the third and fourth output signals PRE_S and PRE_SB in response to a control signal CTRL provided from the control circuit 240 and output first and second feedback signals FB_INB and FB_IN (see FIG. 3). In addition, the first equalizer circuit 221 may adjust the amount of current in the first and second output signal (PRE_F and PRE_FB) lines according to the voltage levels of the first and second feedback signals FB_INB and FB_IN and adjust the voltage levels of the first and second output signal (PRE_F and PRE_FB) lines. The second equalizer circuit 222 may amplify high frequency components of the first and second output signals PRE_F and PRE_FB.

The level conversion circuit 230 may be connected to fifth and sixth output signal (AMP_O and AMP_OB) lines, amplify a voltage difference between the fifth output signal AMP_O and the sixth output signal AMP_OB, and generate an internal signal INT_SIG having a CMOS level. The internal signal INT_SIG may be provided to internal circuits of the semiconductor device including the receiver 200 and perform an operation corresponding to the function of the input signal SIG.

The control circuit 240 may be connected to an internal signal (INT_SIG) line and may generate a control signal CTRL of a pulse type whenever the logic level of the internal signal INT_SIG transitions, that is, when the logic level of the internal signal INT_SIG transitions from logic high to logic low or from logic low to logic high. According to example embodiments, the control circuit 240 may change the logic level of the control signal CTRL in response to a selection signal SEL (see FIG. 5). Depending on a pulse level or logic level of the control signal CTRL, a charging operation of low pass filters (including resistors R5 and R6 and capacitors C5 and C6 in FIGS. 3 and 5) of the first equalizer circuit 221 may be selectively turned on or turned off. Average voltage levels of the third and fourth output signals PRE_S and PRE_SB may be generated by the charging operation of the low pass filters (including the resistors R5 and R6 and the capacitors C5 and C6) and thus the first and second feedback signals FB_INB and FB_IN (see FIG. 3) may be output. According to example embodiments, the control circuit 240 may generate a control signal that has a logic level at which the charging operation of the low pass filters (including the resistors R5 and R6 and the capacitors C5 and C6) is performed in an initial state of the receiver 200 and has a pulse level whenever the logic level of the internal signal INT_SIG transitions.

When the receiver 200 determines the bits of the received input signal SIG having a CML level and outputs the internal signal INT_SIG having a CMOS level, the receiver 200 may cancel a common mode offset between the average voltage level of the input signal SIG and the level of the reference voltage VREF in response to the control signal CTRL and may cancel crosstalk generated in the internal signal INT_SIG.

Some examples may be described using the expressions "connected" and/or "coupled" along with their derivatives. These terms are not necessarily intended as synonyms for each other. For example, a description using the terms "connected" and/or "coupled" may indicate that two or more elements are in direct physical or electrical contact with each other. In addition, the terms "connecting" and/or "coupling" may mean that two or more elements are not in direct contact with each other but still cooperate or interact with each other.

Figure 3:
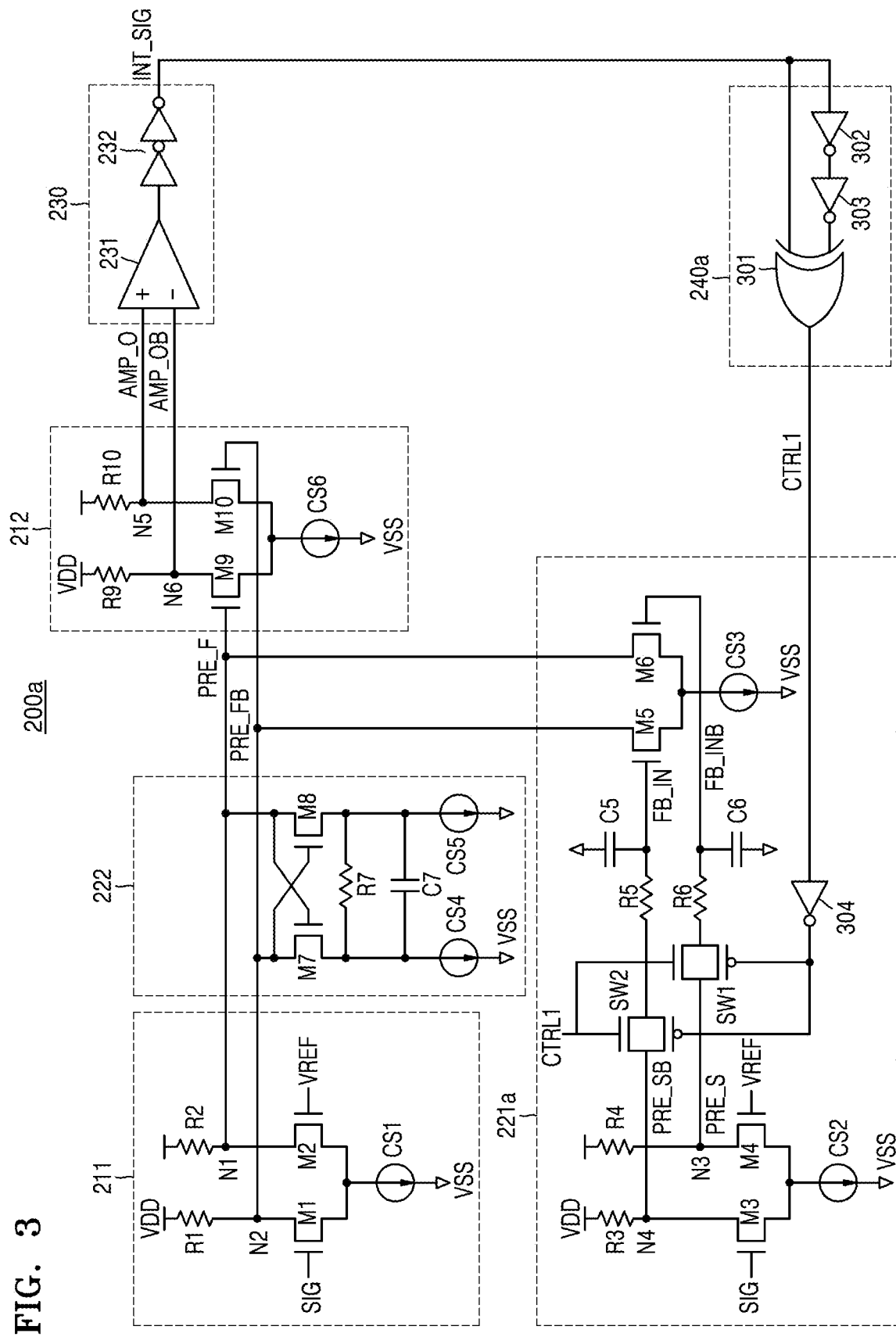
FIG. 3 is a circuit diagram of a receiver circuit that is an implementation example of the receiver of FIG. 2.

FIG. 3 is a circuit diagram of a receiver circuit 200a that is an implementation example of the receiver 200 of FIG. 2. Hereinafter, subscripts attached to reference numbers (e.g., a of 200a and a of 240a) are used to distinguish a plurality of circuits having the same function.

Referring to FIG. 3, a first amplifier circuit 211 may compare the voltage level of the input signal SIG with the level of the reference voltage VREF, amplify a voltage difference between the voltage level of the input signal SIG and the level of the reference voltage VREF, and generate the first and second output signals PRE_F and PRE_FB at first and second nodes N1 and N2. The reference voltage VREF may be provided from within of a semiconductor device in which the receiver circuit 200a is implemented, or may be provided from an external device. The first amplifier circuit 211 may include transistors M1 and M2, resistors R1 and R2, and/or a current source CS1. The transistors M1 and M2 may be implemented as N-type metal oxide semiconductor (NMOS) transistors.

The input signal (SIG) line may be connected to the gate terminal of the transistor M1. The source terminal (e.g., a first terminal) of the transistor M1 may be connected to the current source CS1, and the drain terminal (e.g., a second terminal) of the transistor M1 may be connected to the resistor R1. The transistor M1 may control the amount of current flowing between the drain terminal and the source terminal thereof according to the voltage level of the input signal SIG. A reference voltage (VREF) line may be connected to the gate terminal of the transistor M2. The source terminal of the transistor M2 may be connected to the current source CS1, and the drain terminal of the transistor M2 may be connected to the resistor R2.

The current source CS1 may provide a bias current flowing through the transistors M1 and M2. The gain of the first amplifier circuit 211 may vary according to the magnitude of the bias current. The first amplifier circuit 211 may also be referred to as a variable gain amplifier (VGA). The current source CS1 may be a transistor having a gate terminal connected to a bias voltage line, a drain terminal connected to the transistors M1 and M2, and a source terminal connected to a ground voltage VSS.

The resistor R1 may be connected between a power supply voltage VDD and the drain terminal of the transistor M1. The resistor R2 may be connected between the power supply voltage VDD and the drain terminal of the transistor M2. Each of the resistors R1 and R2 may be implemented using a passive device or a transistor. The transistors M1 and M2 may be implemented identical to each other, and the resistors R1 and R2 may be implemented identical to each other.

The first amplifier circuit 211 may be a CML circuit. The first output signal PRE_F may be output from a first connection node N1 between the drain terminal of the transistor M2 and the resistor R2, and the second output signal PRE_FB may be output from a second connection node N2 between the drain terminal of the transistor M1 and the resistor R1. In the first amplifier circuit 211, the voltage levels (e.g., swing levels) of the first and second output signals PRE_F and PRE_FB may be determined according to a voltage difference between the voltage level of the input signal SIG and the level of the reference voltage REF.

In order to verify the operation of the receiver circuit 200a, the level of the reference voltage VREF may be swept in a predetermined or alternatively, desired range and step units. The level of the reference voltage VREF may be determined by evaluating a voltage margin, a timing margin, or an eye diagram, through which the receiver circuit 200a may effectively determine, sense, or sample the input signal SIG. In some example embodiments of single-ended signaling, the input signal SIG may be received from outside of a semiconductor device including the receiver circuit 200a, and the reference voltage VREF may be generated within the semiconductor device. A common mode offset may occur between the input signal SIG and the reference voltage VREF due to the transmission environment of the input signal (SIG) line and process voltage temperature (PVT) variations of integrated circuits in the semiconductor device. The common mode offset refers to a voltage difference between the average voltage level of the input signal SIG and the level of the reference voltage VREF.

The voltage level of the input signal SIG input to the first amplifier circuit 211 and the level of the reference voltage VREF may be expressed as the sum of a differential input and a common mode input. The differential input may correspond to a voltage difference between the voltage level of the input signal SIG and the level of the reference voltage VREF. The common mode input may be common to both the voltage level of the input signal SIG and the level of the reference voltage VREF, and may correspond to the average of the voltage level of the input signal SIG and the level of the reference voltage VREF. The first amplifier circuit 211 may amplify the differential input and suppress the common mode input. The performance of the first amplifier circuit 211 may be evaluated by a common mode rejection ratio (CMRR). The common mode offset may lower the degree to which the differential input is amplified by the first amplifier circuit 211, the degree to which the common mode input is suppressed by the first amplifier circuit 211, the CMRR of the first amplifier circuit 211, and the AC amplification factor of the first amplifier circuit 211. Accordingly, the common mode offset may reduce a voltage margin or a timing margin through which the receiver circuit 200a may effectively sense or sample the input signal SIG.

A first equalizer circuit 221a may be configured to cancel a common mode offset between the average voltage level of the input signal SIG and the level of the reference voltage VREF. Also, the first equalizer circuit 221a may be configured to cancel crosstalk generated in the internal signal INT_SIG according to a level change of the reference voltage VREF.

The first equalizer circuit 221a may include transistors M3 and M4, resistors R3 and R4, and/or a current source CS2, which constitute an amplifier. The amplifier of the first equalizer circuit 221a is a replica circuit of the first amplifier circuit 211 and may be the same or substantially the same as the first amplifier circuit 211. The operations of the components M3, M4, R3, R4, and CS2 of the amplifier of the first equalizer circuit 221a may be the same or substantially the same as the operations of the components M1, M2, R1, R2, and CS1 of the first amplifier circuit 211. The transistors M3 and M4 may be implemented as NMOS transistors.

The third output signal PRE_S may be output from a third connection node N3 between the drain terminal of the transistor M4 and the resistor R4, and the fourth output signal PRE_SB may be output from a fourth connection node N4 between the drain terminal of the transistor M3 and the resistor R3. A third output signal (PRE_S) line may be selectively connected to a resistor R6 through a first switching element SW1 that is turned on or off in response to a control signal CTRL1. A fourth output signal (PRE_SB) line may be selectively connected to a resistor R5 through a second switching element SW2 that is turned on or off in response to the control signal CTRL1. The control signal CTRL1 may be provided from a control circuit 240a and may selectively turn on or off the first and second switching elements SW1 and SW2 in order to cancel the crosstalk generated in the internal signal INT_SIG according to a level change of the reference voltage VREF. The first and second switching elements SW1 and SW2 may be implemented as transmission gates.

The first equalizer circuit 221a may include the resistor R5, the capacitor C5, the resistor R6, and the capacitor C6, which constitute low pass filters. The resistor R6 and the capacitor C6 may constitute a low pass filter that filters the third output signal PRE_S transmitted through the first switching element SW1 to generate the first feedback signal FB_INB. The resistor R5 and the capacitor C5 may constitute a low pass filter that filters the fourth output signal PRE_SB transmitted through the second switching element SW2 to generate the second feedback signal FB_IN. The low pass filters may be referred to as filtering circuits. The capacitors C5 and C6 may be implemented using a MOS transistor, a metal insulator metal (MIM) capacitor, a passive device, or the like.

Switching, toggling, or transition of the input signal SIG may be directly reflected in the third and fourth output signals PRE_S and PRE_SB. The third and fourth output signals PRE_S and PRE_SB may be switched at the transmission speed of the input signal SIG by the amplifier of the first equalizer circuit 221a. The low pass filters including the resistors R5 and R6 and the capacitors C5 and C6 may filter high frequency components of the third and fourth output signals PRE_S and PRE_SB. The first and second feedback signals FB_INB and FB_IN may be similar to direct current (DC) signals. The voltage level of the first feedback signal FB_INB may be an average voltage level of the third output signal PRE_S. The voltage level of the second feedback signal FB_IN may be an average voltage level of the fourth output signal PRE_SB. The average voltage level may be referred to as a common mode voltage level.

The first equalizer circuit 221a may include transistors M5 and M6 and a current source CS3, which constitute a current adjustment circuit. The transistors M5 and M6 may be implemented as NMOS transistors. A second feedback signal (FB_IN) line may be connected to the gate terminal of the transistor M5. The source terminal of the transistor M5 may be connected to the current source CS3, and the drain terminal of the transistor M5 may be connected to the second output signal (PRE_FB) line. A first feedback signal (FB_INB) line may be connected to the gate terminal of the transistor M6. The source terminal of the transistor M6 may be connected to the current source CS3, and the drain terminal of the transistor M6 may be connected to the first output signal (PRE_F) line. The current source CS3 may provide a bias current flowing through the transistors M5 and M6. The current source CS3 may be a transistor that receives a bias voltage through a gate terminal, is connected to the transistors M5 and M6 through a drain terminal, and is connected to the ground voltage VSS through a source terminal.

The current adjustment circuit (including the transistors M5 and M6 and the current source CS3) of the first equalizer circuit 221a may cancel a common mode offset between the first output signal PRE_F and the second output signal PRE_FB of the first amplifier circuit 211, based on a common mode offset between the input signal SIG and the reference voltage VREF. When a common mode offset occurs between the input signal SIG and the reference voltage VREF, a voltage difference or a common mode offset may also occur between average voltage levels of the first and second output signals PRE_F and PRE_FB of the first amplifier circuit 211. Similarly, a voltage difference or a common mode offset may also occur between average voltage levels of the third and fourth output signals PRE_S and PRE_SB of the amplifier of the first equalizer circuit 221a. The voltage level of the first feedback signal FB_INB may be an average voltage level of the third output signal PRE_S, which is generated by the low pass filter including the resistor R6 and the capacitor C6. The voltage level of the second feedback signal FB_IN may be an average voltage level of the fourth output signal PRE_SB, which is generated by the low pass filter including the resistor R5 and the capacitor C5. Accordingly, a voltage difference or a common mode offset may also occur between the first feedback signal FB_INB and the second feedback signal FB_IN.

The transistor M5 in the first equalizer circuit 221a may adjust the amount of current flowing from the second output signal (PRE_FB) line to the ground voltage (VSS) line according to the second feedback signal FB_IN, thereby adjusting the voltage level of the second output signal PRE_FB. The transistor M6 may adjust the amount of current flowing from the first output signal (PRE_F) line to the ground voltage (VSS) line according to the first feedback signal FB_INB, thereby adjusting the voltage level of the first output signal PRE_F.

For example, it is assumed that the average voltage level of the input signal SIG is higher than the level of the reference voltage VREF. The average voltage level of the fourth output signal PRE_SB is lower than the average voltage level of the third output signal PRE_S. The average voltage level of the second feedback signal FB_IN is lower than the average voltage level of the first feedback signal FB_INB. The amount of current flowing through the transistor M5 according to the second feedback signal FB_IN is less than the amount of current flowing through the transistor M6 according to the first feedback signal FB_INB. Because the amount of current flowing through the transistor M6 is relatively large, the voltage level of the first output signal PRE_F may be relatively significantly reduced compared to the voltage level of the second output signal PRE_FB by the transistor M6. Accordingly, the first equalizer circuit 221a may reduce or cancel the common mode offset when the average voltage level of the input signal SIG is higher than the level of the reference voltage VREF.

Conversely, it is assumed that the average voltage level of the input signal SIG is lower than the level of the reference voltage VREF. The average voltage level of the third output signal PRE_S is lower than the average voltage level of the fourth output signal PRE_SB. The average voltage level of the first feedback signal FB_INB is lower than the average voltage level of the second feedback signal FB_IN. The amount of current flowing through the transistor M6 according to the first feedback signal FB_INB is less than the amount of current flowing through the transistor M5 according to the second feedback signal FB_IN. Because the amount of current flowing through the transistor M5 is relatively large, the voltage level of the second output signal PRE_FB may be relatively significantly reduced compared to the voltage level of the first output signal PRE_F by the transistor M5. Accordingly, the first equalizer circuit 221a may cancel the common mode offset when the average voltage level of the input signal SIG is lower than the level of the reference voltage VREF.

The first equalizer circuit 221a may adjust the amount of current flowing through the transistors M5 and M6 to cancel or reduce a voltage difference or a common mode offset between average voltage levels of the first and second output signals PRE_F and PRE_FB, the voltage difference or common mode offset occurring by a common mode offset between the input signal SIG and the reference voltage VREF. The first equalizer circuit 221a may be referred to as a common mode offset cancellation circuit.

A second equalizer circuit 222 may amplify, compensate, or restore a high frequency component of the input signal SIG weakened due to channel loss. The second equalizer circuit 222 may include transistors M7 and M8, a resistor R7, a capacitor C7, and/or current sources CS4 and CS5. The transistors M7 and M8 may be implemented as NMOS transistors. The drain terminal of the transistor M7 and the gate terminal of the transistor M8 may be connected to the second output signal (PRE_FB) line. The gate terminal of the transistor M7 and the drain terminal of the transistor M8 may be connected to the first output signal (PRE_F) line. The source terminal of the transistor M7 may be connected to the current source CS4, one end of the resistor R7, and one end of the capacitor C7. The source terminal of the transistor M8 may be connected to the current source CS5, the other end of the resistor R7, and the other end of the capacitor C7. The transistors M7 and M8 may form a cross coupled pair.

The current source CS4 may provide a bias current flowing through the transistor M7. The current source CS5 may provide a bias current flowing through the transistor M8. The current sources CS4 and CS5 may be transistors that receive bias voltages through gate terminals, respectively, are connected to the transistors M7 and M8 through drain terminals, respectively, and are connected to the ground voltage VSS through source terminals, respectively.

The second equalizer circuit 222 may be a high pass filter that boosts high frequency components of the first and second output signals PRE_F and PRE_FB. The transistors M7 and M8 may amplify the first and second output signals PRE_F and PRE_FB in a positive feedback method. The second equalizer circuit 222 may provide negative impedance or negative capacitance to the first and second output signal (PRE_F and PRE_FB) lines. The second equalizer circuit 222 may be a negative capacitance equalizer (NCE) or a continuous time linear equalizer (CTLE).

The gain of the first amplifier circuit 211 may be reduced by a common mode offset cancellation operation of the first equalizer circuit 221a. A second amplifier circuit 212 may compensate for the reduced gain of the first amplifier circuit 211 by amplifying the first and second output signals PRE_F and PRE_FB output from the first amplifier circuit 211. The second amplifier circuit 212 may amplify a voltage difference between the first output signal PRE_F and the second output signal PRE_FB to output fifth and sixth output signals AMP_O and AMP_OB. The second amplifier circuit 212 may include transistors M9 and M10, resistors R9 and R10, and/or a current source CS6. The transistors M9 and M10 may be implemented as NMOS transistors.

The first output signal (PRE_F) line may be connected to the gate terminal of the transistor M9. The source terminal of the transistor M9 may be connected to the current source CS6, and the drain terminal of the transistor M9 may be connected to the resistor R9. The second output signal (PRE_F) line may be connected to the gate terminal of the transistor M10. The source terminal of the transistor M10 may be connected to the current source CS6, and the drain terminal of the transistor M10 may be connected to the resistor R10. The current source CS6 may provide a bias current flowing through the transistors M9 and M10, and the gain of the second amplifier circuit 212 may vary according to the magnitude of the bias current. The resistor R9 may be connected between the power supply voltage VDD and the drain terminal of the transistor M9, and the resistor R10 may be connected between the power supply voltage VDD and the drain terminal of the transistor M10. The fifth output signal AMP_O may be output from a fifth connection node N5 between the drain terminal of the transistor M10 and the resistor R10, and the sixth output signal AMP_OB may be output from a sixth connection node N6 between the drain terminal of the transistor M9 and the resistor R9.

A level conversion circuit 230 may receive the fifth and sixth output signals AMP_O and AMP_OB of the second amplifier circuit 212 generated according to the input signal SIG swinging based on a CML level, amplify a voltage difference between the fifth output signal AMP_O and the sixth output signal AMP_OB, and generate an internal signal INT_SIG having a CMOS level. The level conversion circuit 230 may include an operational amplifier 231 and/or a buffer 232. In the operational amplifier 231, the fifth output signal AMP_O may be connected to a non-inverting input terminal (+), and the sixth output signal AMP_OB may be connected to an inverting input terminal (−). The operational amplifier 231 may be implemented as an operational transconductance amplifier (OTA), a differential amplifier, or the like. The output signal of the operational amplifier 231 may be output as an internal signal INT_SIG through the buffer 232. The internal signal INT_SIG may be generated as a digital signal having a logic high level or a logic low level, and an internal operation of the semiconductor device may be performed according to a function of the input signal SIG.

A control circuit 240a may generate the control signal CTRL1 by receiving the internal signal INT_SIG of the level conversion circuit 230. The control circuit 240a may include an exclusive OR (XOR) gate 301, first and second inverters 302 and 303 connected in series, and/or a third inverter 304. The XOR gate 301 has a first input terminal for receiving the internal signal INT_SIG, a second input terminal for receiving an output of the first and second inverters 302 and 303 connected in series, and an output terminal for outputting the control signal CTRL1. The third inverter 304 may receive the output of the XOR gate 301 and output an inversion signal of the control signal CTRL1. The control signal CTRL1 may be output as a logic high pulse whenever the logic level of the internal signal INT_SIG transitions, that is, when the logic level of the internal signal INT_SIG transitions from logic high to logic low or from logic low to logic high. The width of the logic high pulse of the control signal CTRL1 may be determined by delay times of the first and second inverters 302 and 303 connected in series. The control signal CTRL1 may be provided to the first and second switching elements SW1 and SW2 of the first equalizer circuit 221a.

Figure 4:
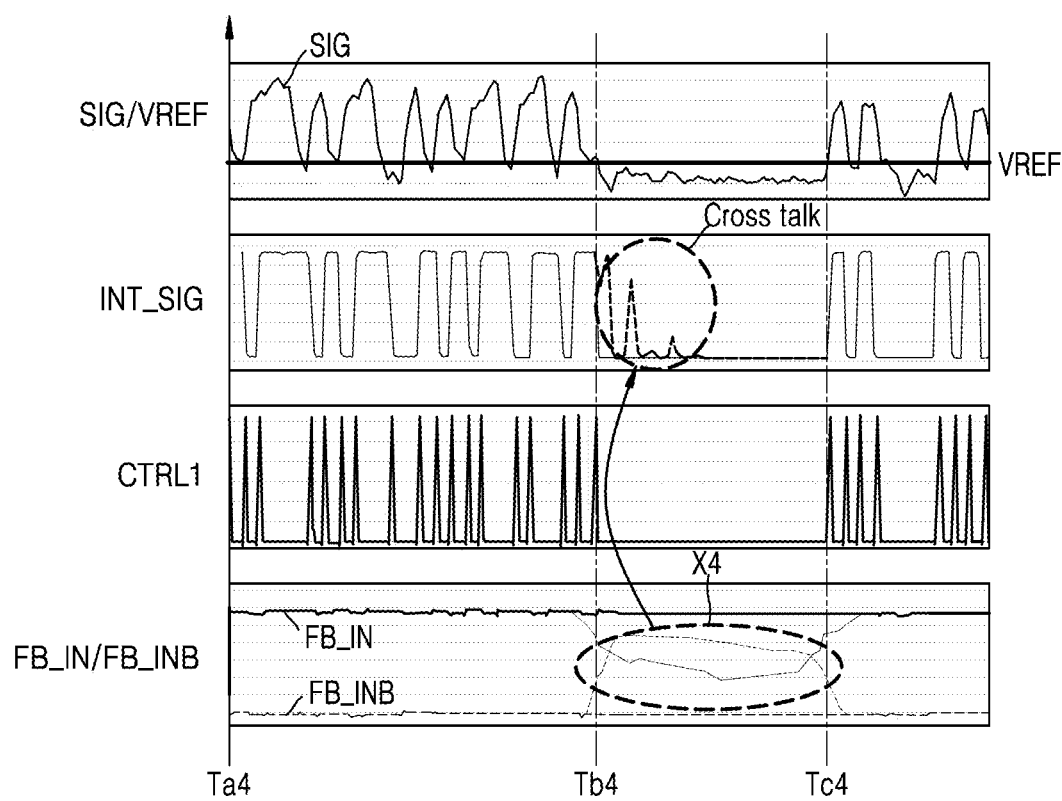
FIG. 4 is a timing diagram illustrating an operation of the receiver circuit of FIG. 3.

FIG. 4 is a timing diagram illustrating an operation of the receiver circuit 200a of FIG. 3. It should be noted that in the timing diagrams described in the inventive concepts, the horizontal axis and the vertical axis represent time and voltage level, respectively, and the timing diagrams are not necessarily drawn to scale.

Referring to FIGS. 3 and 4, an input signal SIG having a CML level may be received by the receiver circuit 200a at time Ta4. It is assumed that the average voltage level of the input signal SIG is higher than the level of the reference voltage VREF. Some example embodiments where the level of the reference voltage VREF used to determine the voltage level of the input signal SIG is near a low voltage level of the input signal SIG will be described.

From time Ta4 to time Tb4, the receiver circuit 200a may determine the bits of the input signal SIG having a CML level and output an internal signal INT_SIG having a CMOS level. In the first amplifier circuit 211, the swing levels of the first and second output signals PRE_F and PRE_FB may be determined according to a voltage difference between the voltage level of the input signal SIG and the level of the reference voltage REF. The second equalizer circuit 222 may amplify a high frequency component of the input signal SIG weakened due to channel loss. The second amplifier circuit 212 may amplify the first and second output signals PRE_F and PRE_FB and output the fifth and sixth output signals AMP_O and AMP_OB, and the level conversion circuit 230 may amplify a voltage difference between the fifth output signal AMP_O and the sixth output signal AMP_OB and generate an internal signal INT_SIG having a logic high level or a logic low level.

The control circuit 240a may generate a control signal CTRL1 having a logic high pulse whenever the logic level of the internal signal INT_SIG transitions and may provide the generated control signal CTRL1 to the first and second switching elements SW1 and SW2 of the first equalizer circuit 221a. The first equalizer circuit 221a may generate third and fourth output signals PRE_S and PRE_SB that are the same as the first and second output signals PRE_F and PRE_FB, respectively, according to a voltage difference between the voltage level of the input signal SIG and the level of the reference voltage REF. The first equalizer circuit 221a may generate average voltage levels of the third and fourth output signals PRE_S and PRE_SB, by the low pass filters (including the resistors R5 and R6 and the capacitors C5 and C6), only when the transmission gates of the first and second switching elements SW1 and SW2 are turned on in response to a logic high pulse of the control signal CTRL1, and may output the average voltage levels as the first and second feedback signals FB_INB and FB_IN. The first equalizer circuit 221a may adjust the amount of current of the first and second output signal (PRE_F and PRE_FB) lines to adjust the voltage levels of the first and second output signal (PRE_F and PRE_FB) lines, according to the first and second feedback signals FB_INB and FB_IN, and thus may cancel a common mode offset between the average voltage level of the input signal SIG and the level of the reference voltage VREF.

From time Tb4 to time Tc4, the input signal SIG having a low level may be received by the receiver circuit 200a for a relatively long time. Because the level of the reference voltage VREF is near the low voltage level of the input signal SIG, the sensing margin of the receiver circuit 200a may decrease when the input signal SIG having the low voltage level is received, and crosstalk may occur in the internal signal INT_SIG. The crosstalk is due to a waveform X4 occurring as the voltage levels of the first and second feedback signals FB_INB and FB_IN are inverted by the charging operation of the low pass filters (including the resistors R5 and R6 and the capacitors C5 and C6) when the first equalizer circuit 221a generates average voltage levels of the third and fourth output signals PRE_S and PRE_SB and outputs the average voltage levels as the first and second feedback signals FB_INB and FB_IN.

The waveform X4 occurring by the inversion of the first and second feedback signals FB_INB and FB_IN may be reduced or prevented when the internal signal INT_SIG is output at a logic low level without a logic level transition, the control signal CTRL1 is output at a logic low level to thereby turn off the transmission gates of the first and second switching elements SW1 and SW2, and thus, the charging operation of the low pass filters (including the resistors R5 and R6 and the capacitors C5 and C6) are stopped. Accordingly, the first equalizer circuit 221a may cancel crosstalk of the internal signal INT_SIG.

At time Tc4, the receiver circuit 200a may determine the bits of the input signal SIG having a CML level and output the internal signal INT_SIG having a CMOS level, similar to the operation between time Ta4 and time Tb4.

The receiver circuit 200a in FIG. 3 may cancel a common mode offset between the average voltage level of the input signal SIG and the level of the reference voltage VREF, and crosstalk occurring in the internal signal INT_SIG even when the sensing margin of the receiver circuit 200a is small because the level of the reference voltage VREF used to determine the voltage level of the input signal SIG is near the low level of the input signal SIG.

Figure 5:
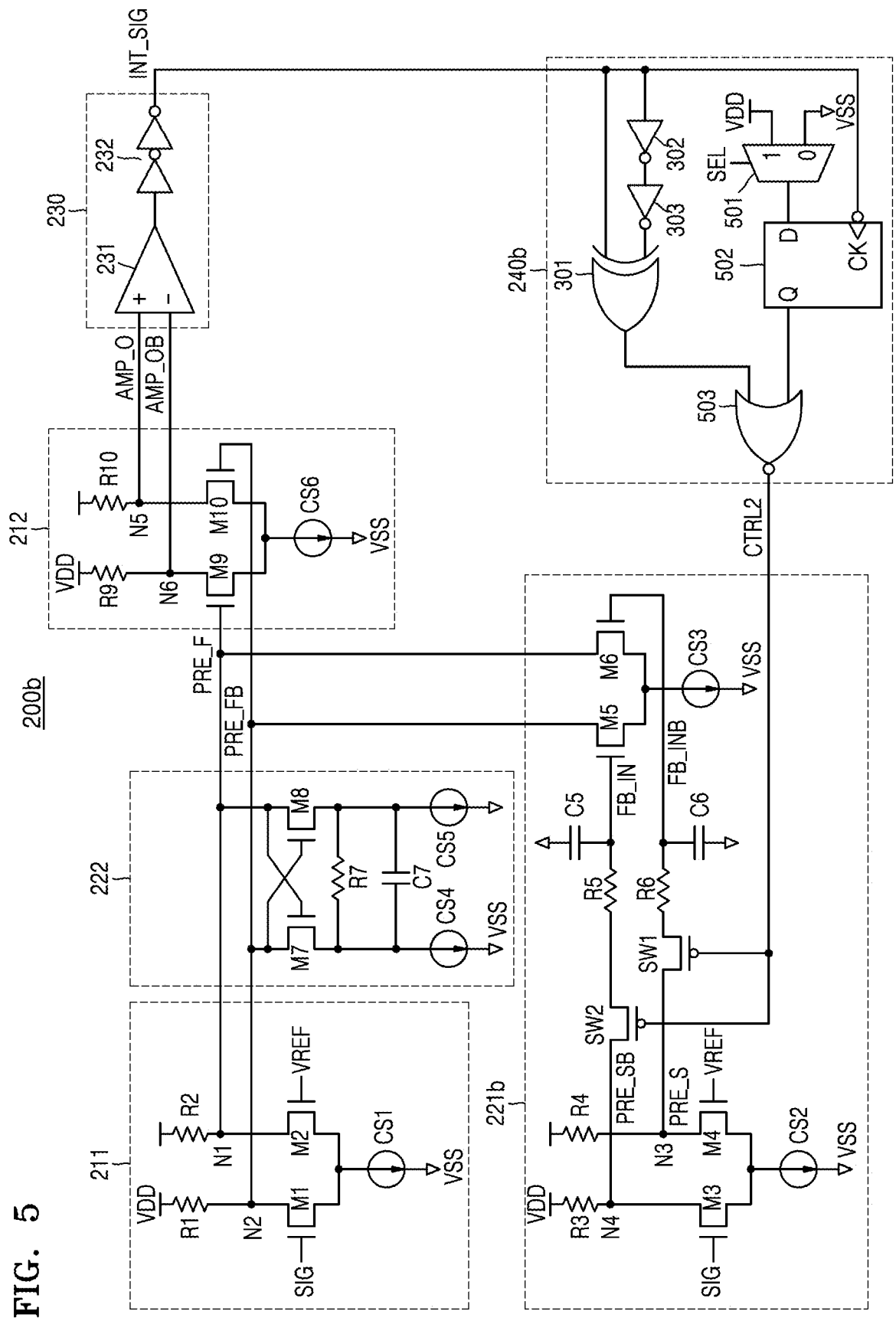
FIG. 5 is a circuit diagram of a receiver circuit according to example embodiments of the inventive concepts.

FIG. 5 is a circuit diagram of a receiver circuit 200b according to example embodiments of the inventive concepts. The receiver circuit 200b of FIG. 5 is a modified example of the receiver circuit 200a of FIG. 3. The configurations of a first equalizer circuit 221b and a control circuit 240b in the receiver circuit 200b of FIG. 5 are different from those of the first equalizer circuit 221a and the control circuit 240a in the receiver circuit 200a of FIG. 3. For convenience of description, descriptions of configurations that are the same or substantially the same as those described above with reference to FIG. 3 will be omitted.

Referring to FIG. 5, first and second switching elements SW1 and SW2 of the first equalizer circuit 221b may be implemented as PMOS transistors instead of the transmission gates described with reference to FIG. 3.

The control circuit 240b may include an XOR gate 301, first and second inverters 302 and 303 connected in series, a multiplexer 501, a flip-flop 502, and/or a NOR gate 503. As described with reference to FIG. 3, the XOR gate 301 may output a logic high pulse whenever the logic level of an internal signal INT_SIG transitions. The output signal of the XOR gate 301 may be the same as the control signal CTRL1 of FIG. 3. The output signal of the XOR gate 301 may be provided to a first input terminal of the NOR gate 503.

The multiplexer 501 has a first input terminal connected to a power supply voltage (VDD) line, a second input terminal connected to a ground voltage (VSS) line, and an output terminal. The multiplexer 501 may provide a power supply voltage (VDD) level of the first input terminal thereof to a data input terminal D of the flip-flop 502 in response to a logic high level of a selection signal SEL, and may provide a ground voltage (VSS) level of the second input terminal thereof to the data input terminal D of the flip-flop 502 in response to a logic low level of the selection signal SEL. When a semiconductor device including the receiver circuit 200b is implemented as a memory device, the selection signal SEL may be provided by a mode register set (MRS). According to example embodiments, the selection signal SEL may be provided from outside of a semiconductor device including the receiver circuit 200b.

The flip-flop 502 has the data input terminal D for receiving an output of the multiplexer 501, a clock input terminal CK for receiving an internal signal INT_SIG, and an output terminal. When the internal signal INT_SIG transitions from a logic high level to a logic low level, the flip-flop 502 may receive the output of the multiplexer 501 and output the received output to a second input terminal of the NOR gate 503.

The NOR gate 503 has a first input terminal for receiving an output of the XOR gate 301, a second input terminal for receiving an output of the flip-flop 502, and an output terminal for outputting a control signal CTRL2. The control signal CTRL2 may be output at a logic low level when the selection signal SEL is at a logic high level. The control signal CTRL2 may be output as an inversion signal of the output of the XOR gate 301 when the selection signal SEL is at a logic low level.

The control signal CTRL2 of the control circuit 240b may be provided to the gates of PMOS transistors, which are the first and second switching elements SW1 and SW2 of the first equalizer circuit 221b. When the PMOS transistors of the first and second switching elements SW1 and SW2 are turned on by the control signal CTRL2, average voltage levels of third and fourth output signals PRE_S and PRE_SB may be generated by a charging operation of low pass filters (including resistors R5 and R6 and capacitors C5 and C6) of the first equalizer circuit 221b and be output as first and second feedback signals FB_INB and FB_IN.

When the PMOS transistors of the first and second switching elements SW1 and SW2 are turned off by the control signal CTRL2, the charging operation of the low pass filters (including the resistors R5 and R6 and the capacitors C5 and C6) of the first equalizer circuit 221b may be stopped and thus crosstalk of the internal signal INT_SIG may be cancelled.

Figure 6:
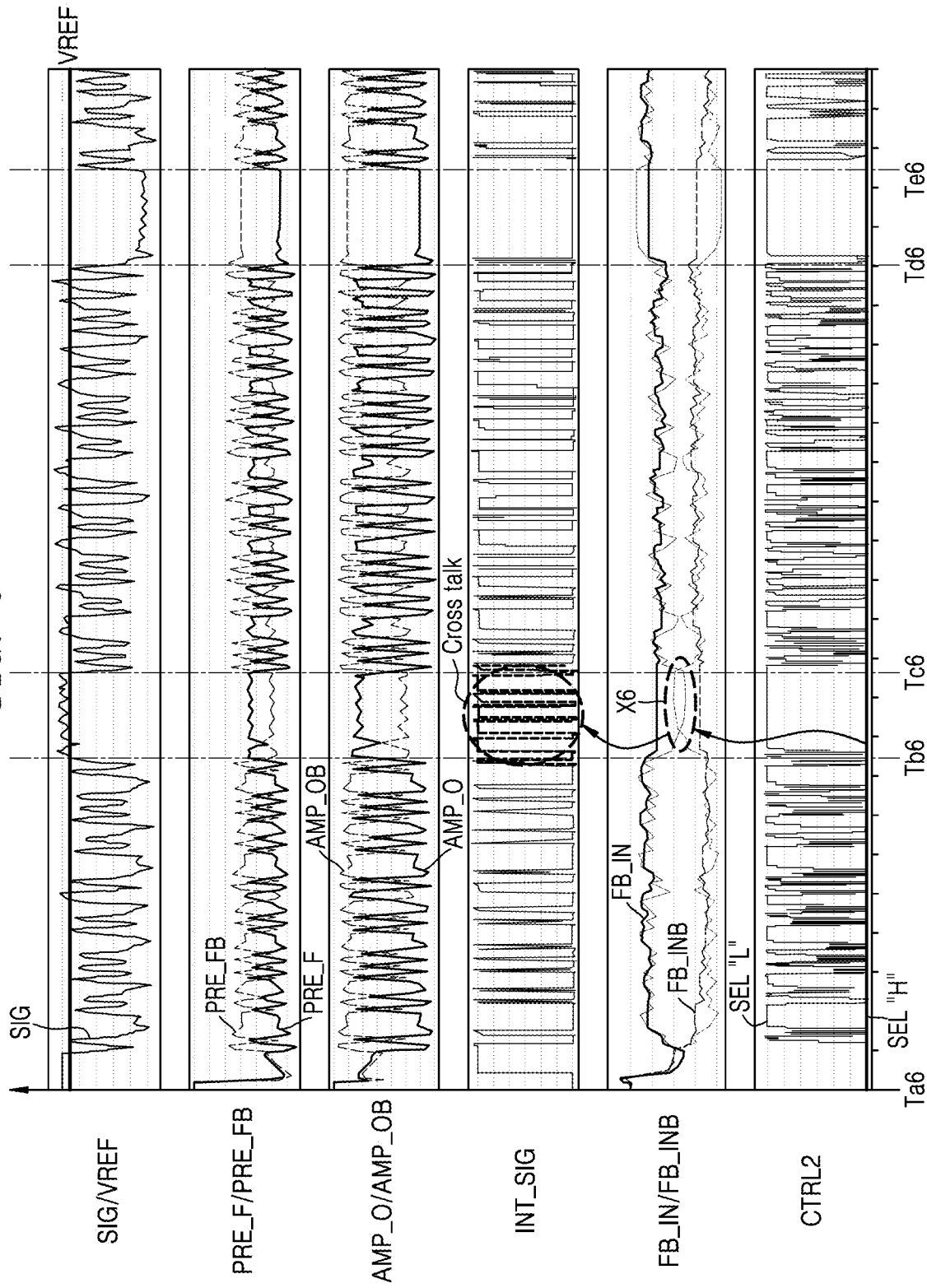
FIGS. 6 to 8 are timing diagrams illustrating an operation of the receiver circuit of FIG. 5.
Figure 7:
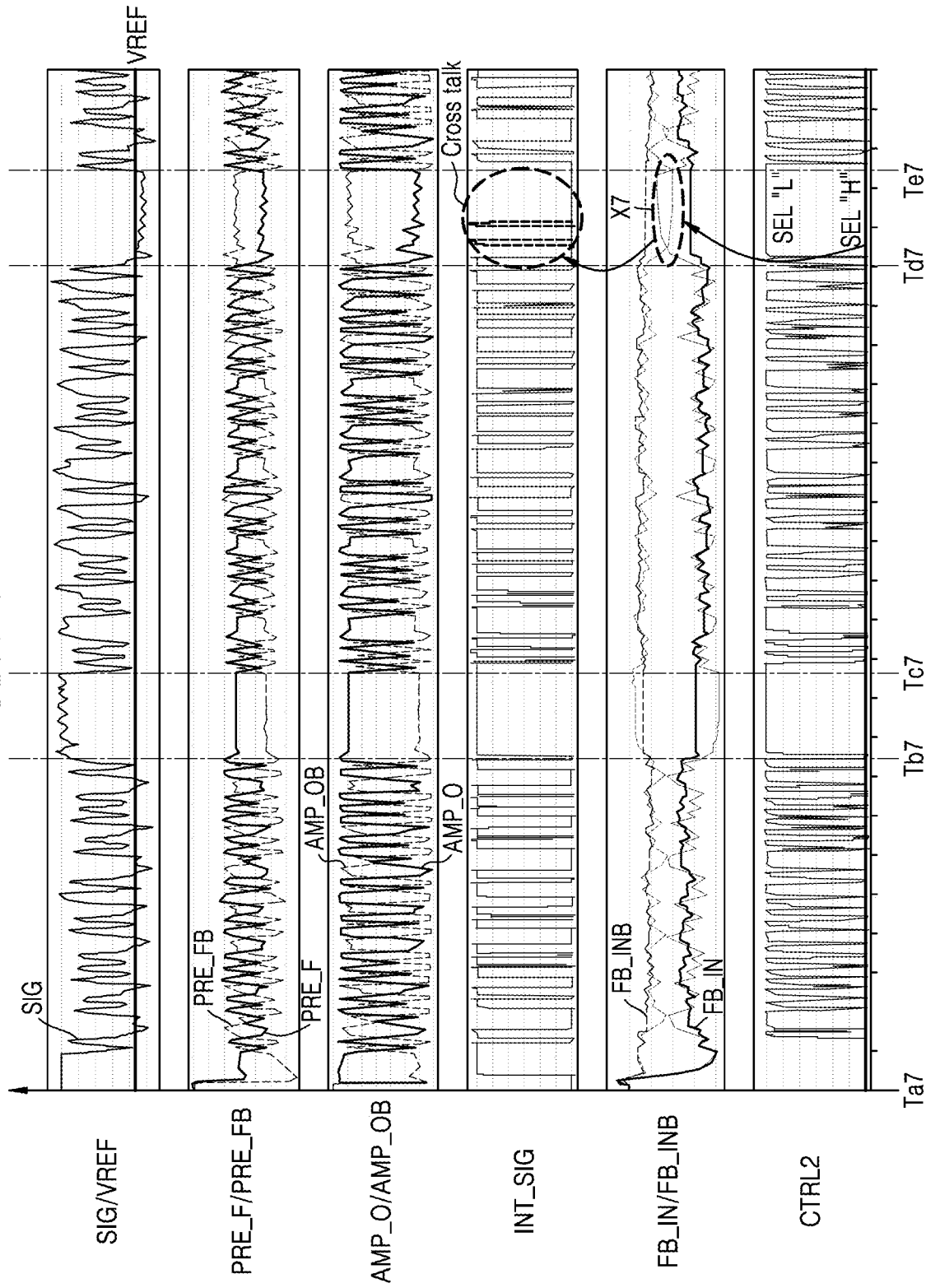
Figure 8:
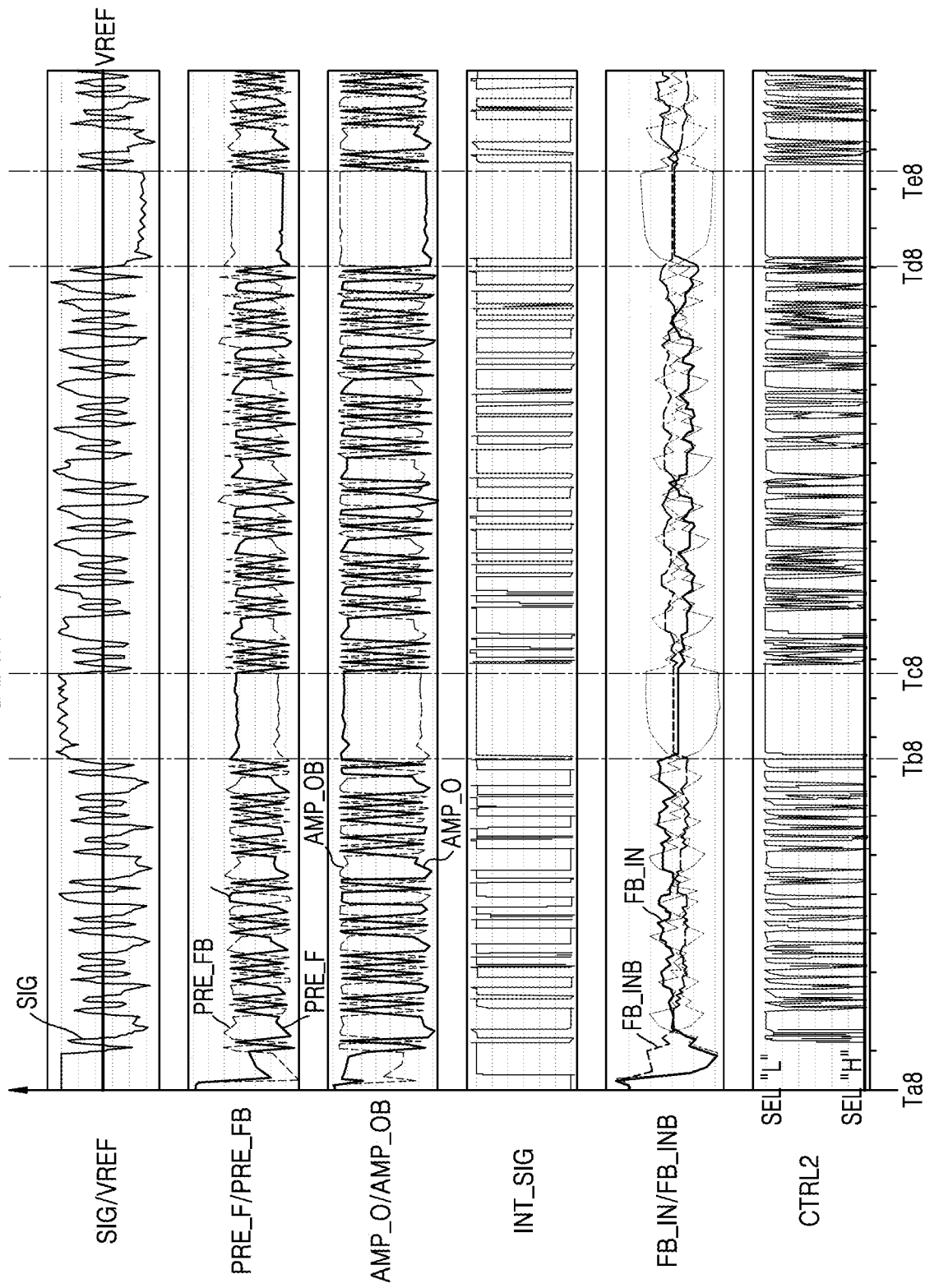

FIGS. 6 to 8 are timing diagrams illustrating an operation of the receiver circuit 200b of FIG. 5. FIG. 6 illustrates some example embodiments where the level of the reference voltage VREF used to determine the voltage level of the input signal SIG is near a high voltage level of the input signal SIG, FIG. 7 illustrates some example embodiments where the level of the reference voltage VREF is near a low voltage level of the input signal SIG, and FIG. 8 illustrates some example embodiments where the level of the reference voltage VREF is near an intermediate voltage level of the input signal SIG.

Referring to FIGS. 5 and 6, because the level of the reference voltage VREF is near the high level voltage of the input signal SIG, the sensing margin of the receiver circuit 200b may decrease when the input signal SIG having the high voltage level is received. At time Ta6, the input signal SIG may be received by the receiver circuit 200b.

In the receiver circuit 200b, from time Ta6 to time Tb6, the first amplifier circuit 211 may output first and second output signals PRE_F and PRE_FB according to a voltage difference between the voltage level of the input signal SIG and the level of the reference voltage REF, the second amplifier circuit 212 may amplify the first and second output signals PRE_F and PRE_FB and output fifth and sixth output signals AMP_O and AMP_OB, and the level conversion circuit 230 may amplify a voltage difference between the fifth output signal AMP_O and the sixth output signal AMP_OB and generate an internal signal INT_SIG having a logic high level or a logic low level.

The control circuit 240b may output a control signal CRTL2 having a logic low (L) level when the selection signal SEL is at a logic high (H) level, and may output an inversion signal of a logic high pulse, that is, a logic low pulse, whenever the logic level of the internal signal INT_SIG transitions when the selection signal SEL is at a logic low (L) level. When the PMOS transistors of the first and second switching elements SW1 and SW2 of the first equalizer circuit 221b are turned on in response to a logic low (L) level or a logic low pulse of the control signal CRTL2, average voltage levels of the third and fourth output signals PRE_S and PRE_SB may be generated by the low pass filters (including the resistors R5 and R6 and the capacitors C5 and C6) and be output as the first and second feedback signals FB_INB and FB_IN. The first equalizer circuit 221b may adjust the amount of current of the first and second output signal (PRE_F and PRE_FB) lines to adjust the voltage levels of the first and second output signal (PRE_F and PRE_FB) lines, according to the first and second feedback signals FB_INB and FB_IN, and thus may cancel a common mode offset between the average voltage level of the input signal SIG and the level of the reference voltage VREF.

From time Tb6 to time Tc6, the input signal SIG having a high level may be received by the receiver circuit 200b for a relatively long time. Because the level of the reference voltage VREF is near the high voltage level of the input signal SIG, the sensing margin of the receiver circuit 200b may be small.

The PMOS transistors of the first and second switching elements SW1 and SW2 of the first equalizer circuit 221b may remain turned on in response to a logic low (L) level of the control signal CTRL2 when the selection signal SEL is at a logic high (H) level. In some example embodiments, when the first equalizer circuit 221b generates average voltage levels of the third and fourth output signals PRE_S and PRE_SB and outputs the average voltage levels as the first and second feedback signals FB_INB and FB_IN, the voltage levels of the first and second feedback signals FB_INB and FB_IN may be inverted like a waveform X6 by the charging operation of the low pass filters (including the resistors R5 and R6 and the capacitors C5 and C6). Accordingly, crosstalk may occur in the internal signal INT_SIG, which the receiver circuit 200b outputs by determining the bits of an input signal SIG having a CML level.

In order to cancel the crosstalk of the internal signal INT_SIG, the selection signal SEL may be provided at a logic low (L) level. The control circuit 240b may output the control signal CTRL2 having a logic high level based on the selection signal SEL having a logic low (L) level and the internal signal INT_SIG having a logic high level. As the PMOS transistors of the first and second switching elements SW1 and SW2 of the first equalizer circuit 221b are turned off according to the logic high level of the control signal CTRL2 and the charging operation of the low pass filters (including the resistors R5 and R6 and the capacitors C5 and C6) is stopped, the voltage levels of the first and second feedback signals FB_INB and FB_IN are not inverted. By adjusting the voltage levels of the first and second output signal (PRE_F and PRE_FB) lines by adjusting the amount of current of the first and second output signal (PRE_F and PRE_FB) lines without inverting the voltage levels of the first and second feedback signals FB_INB and FB_IN, a common mode offset between the average voltage level of the input signal SIG and the level of the reference voltage VREF may be cancelled and the crosstalk of the internal signal INT_SIG may be cancelled.

From time Tc6 to time Td6, the receiver circuit 200b may determine the bits of the input signal SIG having a CML level and output the internal signal INT_SIG having a CMOS level, similar to the operation between time Ta6 and time Tb6.

From time Td6 to time Te6, the input signal SIG having a low level may be received by the receiver circuit 200b for a relatively long time. Because the level of the reference voltage VREF is sufficiently higher than the voltage level of the input signal SIG, the sensing margin of the receiver circuit 200b may be sufficient. The receiver circuit 200b may determine the bits of the input signal SIG having a CML level and stably output the internal signal INT_SIG having a CMOS level without crosstalk, similar to the operation between time Ta6 and time Tb6.

At time Te6, the receiver circuit 200b may determine the bits of the input signal SIG having a CML level and output the internal signal INT_SIG having a CMOS level, similar to the operation between time Ta6 and time Tb6.

As described with reference to FIGS. 5 and 6, the receiver circuit 200b may cancel a common mode offset between the average voltage level of the input signal SIG and the level of the reference voltage VREF, and crosstalk occurring in the internal signal INT_SIG even when the sensing margin of the receiver circuit 200b is small because the level of the reference voltage VREF used to determine the voltage level of the input signal SIG is near the high voltage level of the input signal SIG.

Referring to FIGS. 5 and 7, because the level of the reference voltage VREF is near the low level of the input signal SIG, the sensing margin of the receiver circuit 200b may decrease when the input signal SIG having the low level is received. At time Ta7, the input signal SIG may be received by the receiver circuit 200b.

From time Ta7 to time Td7, the receiver circuit 200b may determine the bits of the input signal SIG having a CML level and stably output the internal signal INT_SIG having a CMOS level, similar to the operation between time Ta6 and time Tb6 of FIG. 6.

From time Td7 to time Tel, the input signal SIG having a low level may be received by the receiver circuit 200b for a relatively long time. Because the level of the reference voltage VREF is near the low level of the input signal SIG, the sensing margin of the receiver circuit 200b may be small.

The PMOS transistors of the first and second switching elements SW1 and SW2 of the first equalizer circuit 221b may remain turned on in response to a logic low (L) level of the control signal CTRL2 when the selection signal SEL is at a logic high (H) level. In some example embodiments, when the first equalizer circuit 221b generates average voltage levels of the third and fourth output signals PRE_S and PRE_SB and outputs the average voltage levels as the first and second feedback signals FB_INB and FB_IN, the voltage levels of the first and second feedback signals FB_INB and FB_IN may be inverted like a waveform X7 by the charging operation of the low pass filters (including the resistors R5 and R6 and the capacitors C5 and C6). Accordingly, crosstalk may occur in the internal signal INT_SIG, which the receiver circuit 200b outputs by determining the bits of an input signal SIG having a CML level.

In order to cancel the crosstalk of the internal signal INT_SIG, the selection signal SEL may be provided at a logic low (L) level. The control circuit 240b may output the control signal CTRL2 having a logic high level based on the selection signal SEL having a logic low (L) level and the internal signal INT_SIG having a logic low level. As the PMOS transistors of the first and second switching elements SW1 and SW2 of the first equalizer circuit 221b are turned off according to the logic high level of the control signal CTRL2 and the charging operation of the low pass filters (including the resistors R5 and R6 and the capacitors C5 and C6) is stopped, the voltage levels of the first and second feedback signals FB_INB and FB_IN are not inverted. By adjusting the voltage levels of the first and second output signal (PRE_F and PRE_FB) lines by adjusting the amount of current of the first and second output signal (PRE_F and PRE_FB) lines without inverting the voltage levels of the first and second feedback signals FB_INB and FB_IN, a common mode offset between the average voltage level of the input signal SIG and the level of the reference voltage VREF may be cancelled and the crosstalk of the internal signal INT_SIG may be cancelled.

At time Te1, the receiver circuit 200b may determine the bits of the input signal SIG having a CML level and output the internal signal INT_SIG having a CMOS level, similar to the operation between time Ta6 and time Tb6.

As described with reference to FIGS. 5 and 7, the receiver circuit 200b may cancel a common mode offset between the average voltage level of the input signal SIG and the level of the reference voltage VREF, and crosstalk occurring in the internal signal INT_SIG even when the sensing margin of the receiver circuit 200b is small because the level of the reference voltage VREF used to determine the voltage level of the input signal SIG is near the low voltage level of the input signal SIG.

Referring to FIGS. 5 and 8, because the level of the reference voltage VREF is near an intermediate level of the input signal SIG, the sensing margin of the receiver circuit 200b may be sufficient regardless of the high or low level of the received input signal SIG. At time Ta8, the input signal SIG may be received by the receiver circuit 200b.

From time Ta8 to time Te8, the receiver circuit 200b may determine the bits of the input signal SIG having a CML level and output the internal signal INT_SIG having a CMOS level, similar to the operation between time Ta6 and time Tb6 of FIG. 6. Because the level of the reference voltage VREF is near the intermediate level of the input signal SIG, the receiver circuit 200b may secure a sufficient sensing margin.

In the receiver circuit 200b, regardless of the control signal CTRL2 generated by the control circuit 240 in response to a logic high (H) level or a logic low (L) level of the selection signal SEL, the first amplifier circuit 211 may output first and second output signals PRE_F and PRE_FB according to a voltage difference between the voltage level of the input signal SIG and the level of the reference voltage REF. In addition, the first equalizer circuit 221b may generate third and fourth output signals PRE_S and PRE_SB according to the voltage difference between the voltage level of the input signal SIG and the level of the reference voltage REF, may generate average voltage levels of the third and fourth output signals PRE_S and PRE_SB to output the average voltage levels as the first and second feedback signals PRE_S and PRE_SB, and may adjust the amount of current of the first and second output signal (PRE_F and PRE_FB) lines to adjust the voltage levels of the first and second output signal (PRE_F and PRE_FB) lines, according to the voltage levels of the first and second feedback signals FB_INB and FB_IN. In addition, the second amplifier circuit 212 may amplify the first and second output signals PRE_F and PRE_FB and output fifth and sixth output signals AMP_O and AMP_OB, and the level conversion circuit 230 may amplify a voltage difference between the fifth output signal AMP_O and the sixth output signal AMP_OB and stably output an internal signal INT_SIG having a logic high level or a logic low level.

Figure 9:
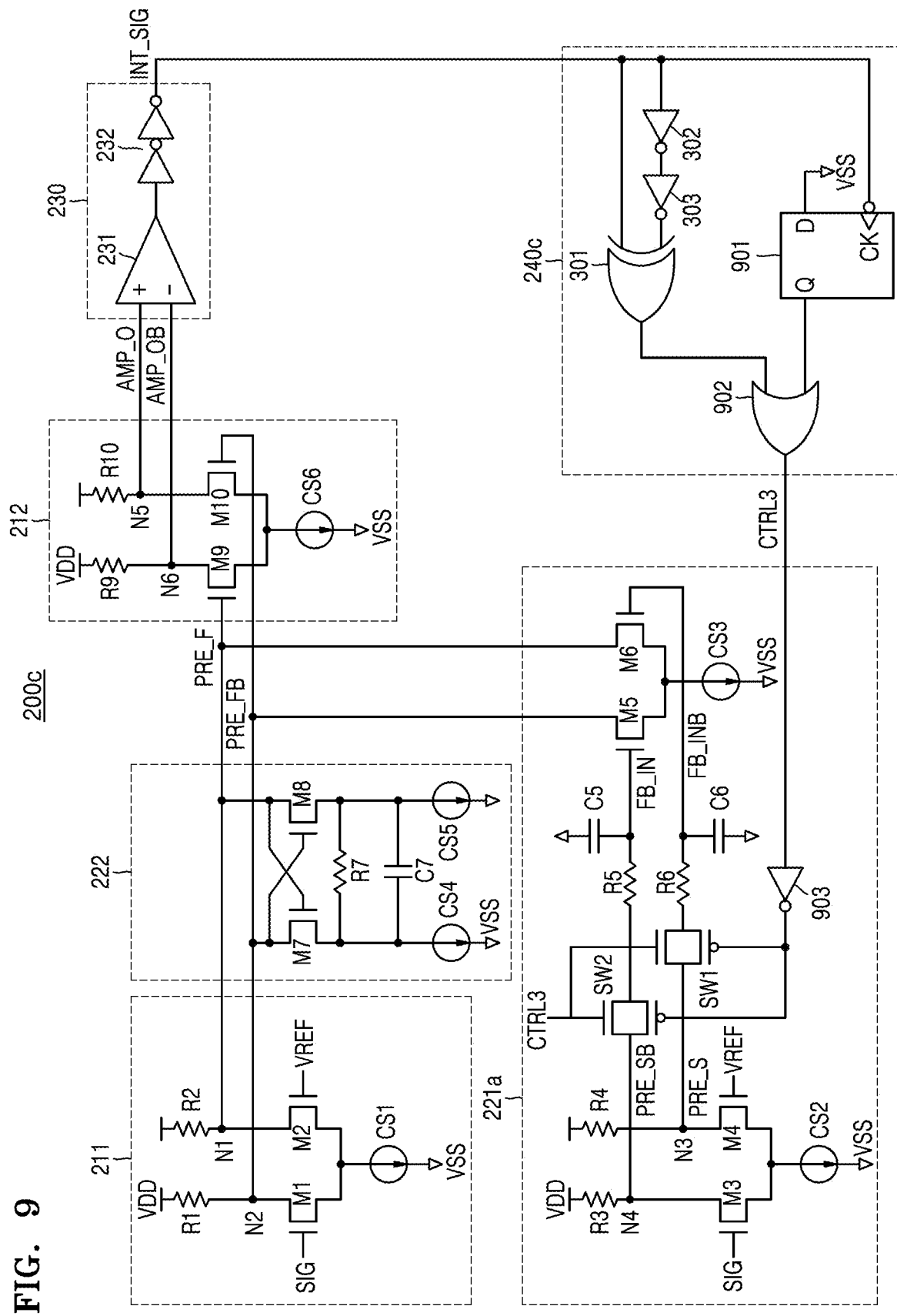
FIG. 9 is a circuit diagram of a receiver circuit according to example embodiments of the inventive concepts.
Figure 10:
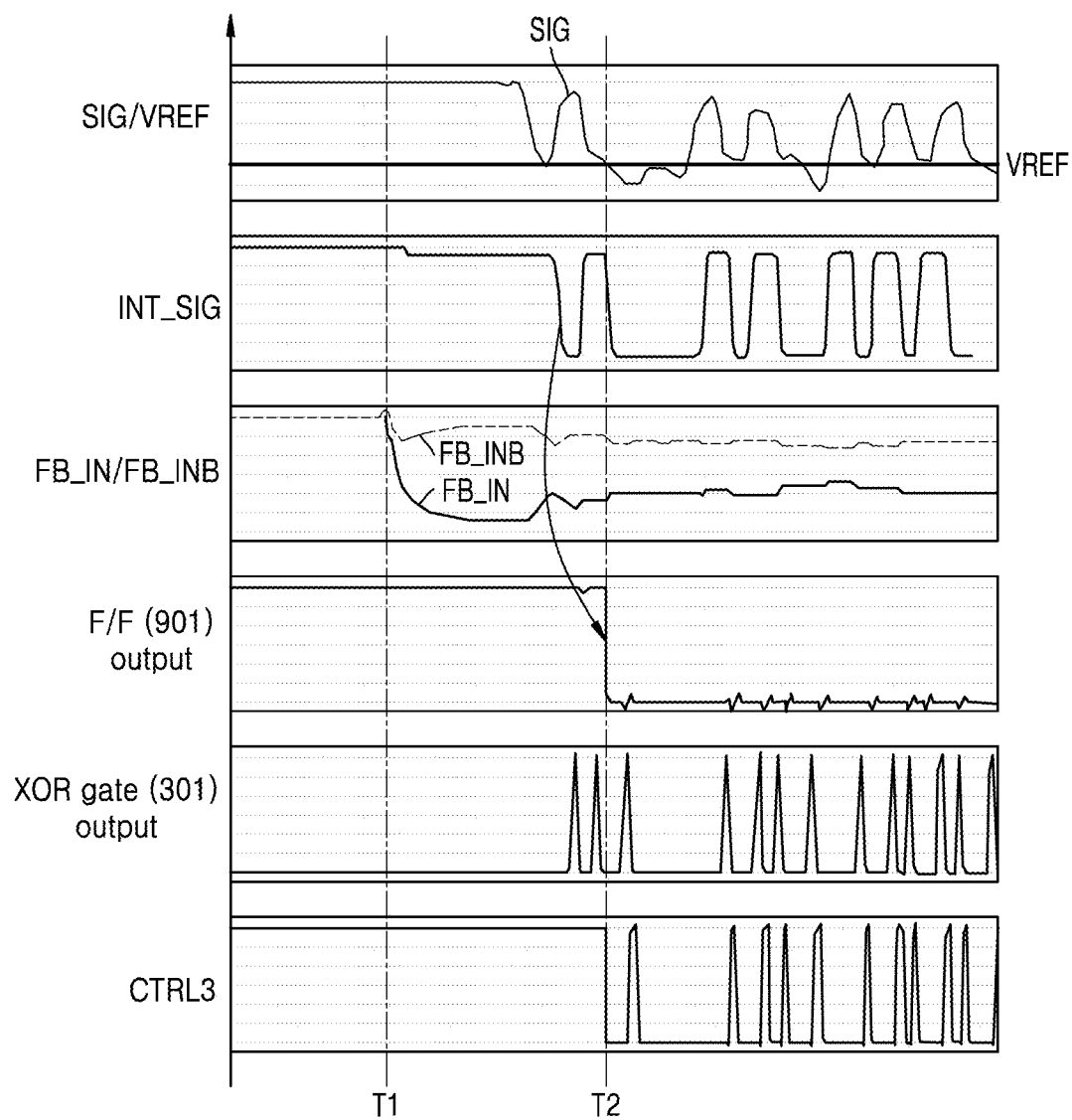
FIG. 10 is a timing diagram illustrating an operation of the receiver circuit of FIG. 9.

FIG. 9 is a circuit diagram of a receiver circuit 200c according to example embodiments of the inventive concepts, and FIG. 10 is a timing diagram illustrating an operation of the receiver circuit 200c of FIG. 9. The receiver circuit 200c of FIG. 9 is a modified example of the receiver circuit 200a of FIG. 3. The configuration of a control circuit 240c in the receiver circuit 200c of FIG. 9 is different from that of the control circuit 240a in the receiver circuit 200a of FIG. 3. For convenience of description, descriptions of configurations that are the same or substantially the same as those described above with reference to FIGS. 3 and 4 will be omitted.

Referring to FIG. 9, the control circuit 240c may include an XOR gate 301, first and second inverters 302 and 303 connected in series, a flip-flop 901, and/or an OR gate 902. As described in FIG. 3, the XOR gate 301 may output a logic high pulse whenever the logic level of an internal signal INT_SIG transitions. The output signal of the XOR gate 301 may be provided to a first input terminal of the OR gate 902.

The flip-flop 901 has a data input terminal D to which a ground voltage (VSS) line is connected, a clock input terminal CK to which an internal signal (INT_SIG) line is connected, and an output terminal. As shown in FIG. 10, the output of the flip-flop 901 may be at a logic high level of a power supply voltage (VDD) level in an initial state, and may be output at a logic low level according to a ground voltage (VSS) level on the data input terminal D when the internal signal INT_SIG transitions from a logic high level to a logic low level. The output of the flip-flop 901 may be provided to a second input terminal of the OR gate 902.

The OR gate 902 has a first input terminal for receiving an output of the XOR gate 301, a second input terminal for receiving an output of the flip-flop 901, and an output terminal for outputting a control signal CTRL3. The third inverter 903 may receive the output of the OR gate 902 and output an inversion signal of the control signal CTRL3. As shown in FIG. 10, the control signal CTRL3 may be output as a result of performing an OR operation on the output of the XOR gate 301 and the output of the flip-flop 502. The control signal CTRL3 may be output to a logic high level at an initial state according to the output of the flip-flop 901, and then may be output according to the output of the XOR gate 301 having a logic high pulse when the internal signal INT_SIG transitions from a logic high level to a logic low level. The control signal CTRL3 of the control circuit 240c may be provided to transmission gates that are the first and second switching elements SW1 and SW2 of the first equalizer circuit 221a.

Referring to FIG. 10, when the transmission gates of the first and second switching elements SW1 and SW2 are turned on by the control signal CTRL3 having a logic high level from time T1 to time T2, a charging operation of the low pass filters (including the resistors R5 and R6 and the capacitors C5 and C6) of the first equalizer circuit 221a may be performed.

At time T2, the transmission gates of the first and second switching elements SW1 and SW2 may be selectively turned on or off by the control signal CTRL3 having a logic high pulse. When the transmission gates of the first and second switching elements SW1 and SW2 are turned off, the charging operation of the low pass filters (including the resistors R5 and R6 and the capacitors C5 and C6) of the first equalizer circuit 221a may be stopped. The first equalizer circuit 221a may selectively turn on or off the charging operation of the low-pass filters (including the resistors R5 and R6 and the capacitors C5 and C6) to thereby generate average voltage levels of the third and fourth output signals PRE_S and PRE_SB and output the average voltage levels as the first and second feedback signals FB_INB and FB_IN.

Figure 11:
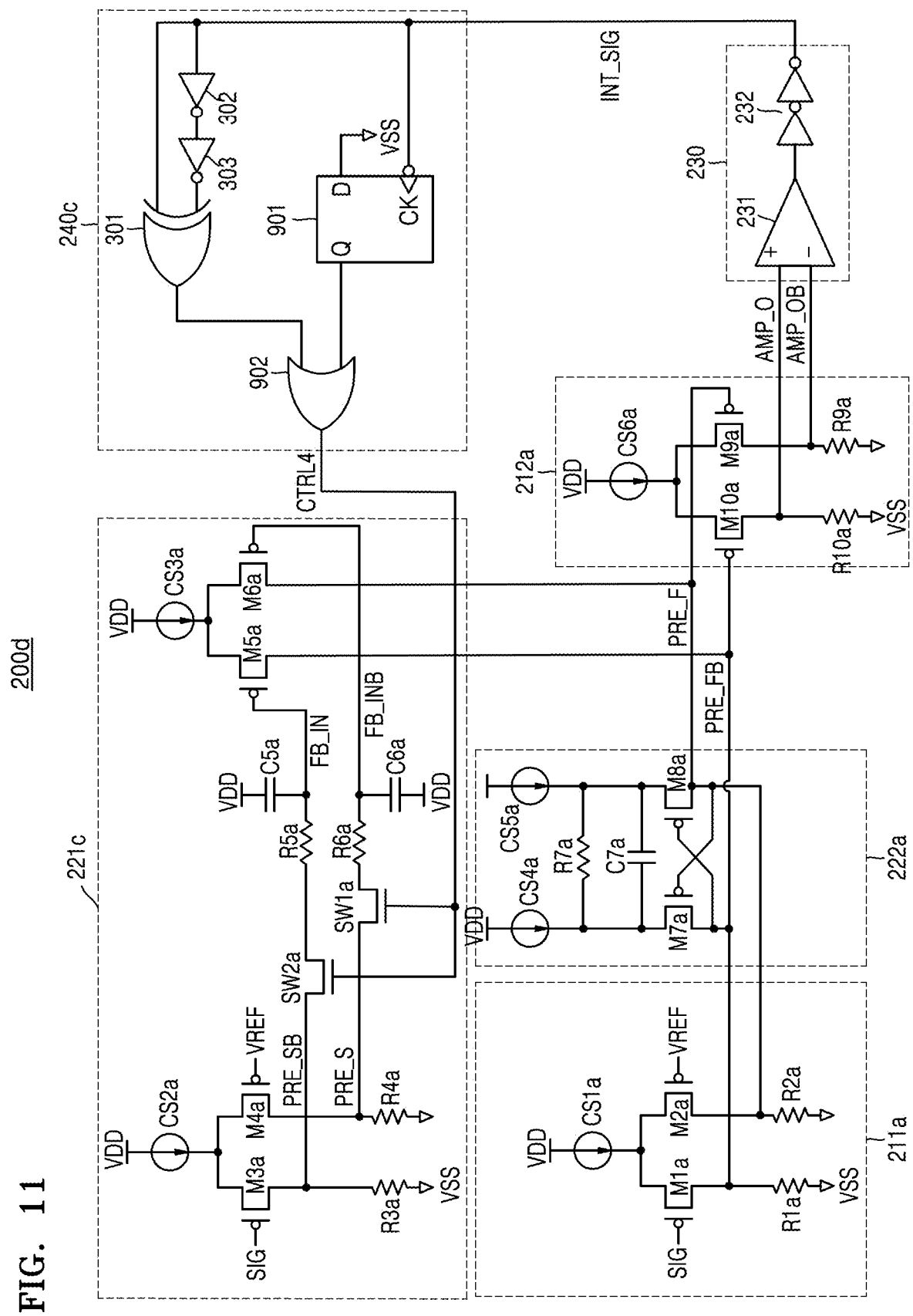
FIG. 11 is a circuit diagram of a receiver circuit according to example embodiments of the inventive concepts.

FIG. 11 is a circuit diagram of a receiver circuit 200d according to example embodiments of the inventive concepts. The receiver circuit 200d of FIG. 11 is a modified example of the receiver circuit 200c of FIG. 9.

Referring to FIG. 11, the configurations of a first amplifier circuit 211a, a second amplifier circuit 212a, a first equalizer circuit 221c, and a second equalizer circuit 222a in the receiver circuit 200d are different from those of the first amplifier circuit 211, the second amplifier circuit 212, the first equalizer circuit 221a, and the second equalizer circuit 222 in the receiver circuit 200c of FIG. 9. In particular, the first equalizer circuit 221c includes switching elements SW1 and SW2 formed of NMOS transistors, compared to the first equalizer circuit 221a of FIG. 9, and thus, the configurations of the first amplifier circuit 211a, the second amplifier circuit 212a, the first equalizer circuit 221c, and the second equalizer circuit 222a are determined according to the characteristics of the NMOS transistors.

The first amplifier circuit 211a may include transistors M1a and M2a, resistors R1a and R2a, and/or a current source CS1a. The transistors M1a and M2a may be implemented as P-type metal oxide semiconductor (PMOS) transistors.

An input signal (SIG) line may be connected to the gate terminal of the transistor M1a. The source terminal of the transistor M1a may be connected to the current source CS1a, and the drain terminal of the transistor M1a may be connected to the resistor R1a. The transistor M1a may control the amount of current flowing between the drain terminal and the source terminal thereof according to the voltage level of an input signal SIG. A reference voltage (VREF) line may be connected to the gate terminal of the transistor M2a. The source terminal of the transistor M2a may be connected to the current source CS1a, and the drain terminal of the transistor M2a may be connected to the resistor R2. The current source CS1a may be connected to a power supply voltage VDD and may provide a bias current flowing through the transistors M1a and M2a. The resistor R1a may be connected between a ground voltage VSS and the drain terminal of the transistor M1a. The resistor R2a may be connected between the ground voltage VSS and the drain terminal of the transistor M2a. A first output signal PRE_F may be output from a connection node between the drain terminal of the transistor M2a and the resistor R2a, and a second output signal PRE_FB may be output from a connection node between the drain terminal of the transistor M1a and the resistor R1a.

The first equalizer circuit 221c may include transistors M3a and M4a, resistors R3a and R4a, and/or a current source CS2a, which constitute an amplifier. The transistors M3a and M4a may be implemented as PMOS transistors. The amplifier of the first equalizer circuit 221c may be the same or substantially the same as the first amplifier circuit 211a. A third output signal PRE_S may be output from a connection node between the drain terminal of the transistor M4a and the resistor R4a, and a fourth output signal PRE_SB may be output from a connection node between the drain terminal of the transistor M3a and the resistor R3a. A third output signal (PRE_S) line may be selectively connected to a resistor R6a through the NMOS transistor of the first switching element SW1a, which is turned on or off in response to a control signal CTRL4. A fourth output signal (PRE_SB) line may be selectively connected to a resistor R5a through the NMOS transistor of the second switching element SW2a, which is turned on or off in response to the control signal CTRL4. The control signal CTRL4 may be provided by a control circuit 240c.

The first equalizer circuit 221c may include the resistor R5a, a capacitor C5a, the resistor R6a, and/or a capacitor C6a, which constitute low pass filters. The resistor R6a and the capacitor C6a may filter the third output signal PRE_S transmitted through the NMOS transistor of the first switching element SW1a to generate a first feedback signal FB_INB, and the resistor R5a and the capacitor C5a may filter the fourth output signal PRE_SB transmitted through the NMOS transistor of the second switching element SW2a to generate a second feedback signal FB_IN.

The first equalizer circuit 221a may include transistors M5a and M6a and/or a current source CS3a, which constitute a current adjustment circuit. The transistors M5a and M6a may be implemented as PMOS transistors. The transistor M5a may have a gate terminal to which a second feedback signal (FB_IN) line is connected, a source terminal to which the current source CS3a is connected, and a drain terminal to which a second output signal (PRE_FB) line is connected. The transistor M6a may have a gate terminal to which a first feedback signal (FB_INB) line is connected, a source terminal to which the current source CS3a is connected, and a drain terminal to which a first output signal (PRE_F) line is connected. The current source CS3a may be connected to the power supply voltage VDD and may provide a bias current flowing through the transistors M5a and M6a.

The second amplifier circuit 212a may amplify the first and second output signals PRE_F and PRE_FB output from the first amplifier circuit 211a to compensate for a reduced gain of the first amplifier circuit 211a. The second amplifier circuit 212a may amplify a voltage difference between the first output signal PRE_F and the second output signal PRE_FB to output fifth and sixth output signals AMP_O and AMP_OB. The second amplifier circuit 212a may include transistors M9a and M10a, resistors R9a and R10a, and/or a current source CS6a. The transistors M9a and M10a may be implemented as PMOS transistors. The transistor M9a may have a gate terminal to which the first output signal (PRE_F) line is connected, a source terminal to which the current source CS6a is connected, and a drain terminal to which the resistor R9a is connected. The transistor M10a may have a gate terminal to which the second output signal (PRE_FB) line is connected, a source terminal to which the current source CS6a is connected, and a drain terminal to which the resistor R10a is connected. The current source CS6a may be connected to the power supply voltage VDD and may provide a bias current flowing through the transistors M9a and M10a. The resistor R9a may be connected between the ground voltage VSS and the drain terminal of the transistor M9a, and the resistor R10a may be connected between the ground voltage VSS and the drain terminal of the transistor M10a. The fifth output signal AMP_O may be output from a connection node between the drain terminal of the transistor M10a and the resistor R10a, and the sixth output signal AMP_OB may be output from a connection node between the drain terminal of the transistor M9a and the resistor R9a.

The second equalizer circuit 222a may include transistors M7a and M8a, a resistor R7a, a capacitor C7a, and/or current sources CS4a and CS5a. The transistors M7a and M8a may be implemented as PMOS transistors. The drain terminal of the transistor M7a and the gate terminal of the transistor M8a may be connected to the second output signal (PRE_FB) line, and the gate terminal of the transistor M7a and the drain terminal of the transistor M8a may be connected to the first output signal (PRE_F) line. The source terminal of the transistor M7a may be connected to the current source CS4a, one end of the resistor R7a, and one end of the capacitor C7a. The source terminal of the transistor M8a may be connected to the current source CS5a, the other end of the resistor R7a, and the other end of the capacitor C7a.

The receiver circuit 200d may operate similarly to the receiver circuit 200c of FIG. 9 described with reference to the timing diagram of FIG. 10. In the receiver circuit 200d, the NMOS transistors of the first and second switching elements SW1a and SW2a may be initially turned on by the control signal CTRL4 having a logic high level, and thus, a charging operation of the low pass filters (including the resistors R5a and R6a and the capacitors C5a and C6a) of the first equalizer circuit 221c may be performed. Thereafter, when an internal signal INT_SIG transitions from a logic high level to a logic low level, the NMOS transistors of the first and second switching elements SW1a and SW2a may be selectively turned on or off by the control signal CTRL4 having a logic high pulse. When the NMOS transistors of the first and second switching elements SW1a and SW2a are turned off, the charging operation of the low pass filters (including the resistors R5a and R6a and the capacitors C5a and C6a) of the first equalizer circuit 221c may be stopped. The first equalizer circuit 221c may selectively turn on or off the charging operation of the low-pass filters (including the resistors R5a and R6a and the capacitors C5a and C6a) to thereby generate average voltage levels of the third and fourth output signals PRE_S and PRE_SB and output the average voltage levels as the first and second feedback signals FB_INB and FB_IN.

The receiver circuit 200d may cancel a common mode offset between the average voltage level of the input signal SIG and the level of the reference voltage VREF, and crosstalk occurring in the internal signal INT_SIG by using the NMOS transistors of the first and second switching elements SW1a and SW2a which are responsive to the control signal CTRL4.

Figure 12:
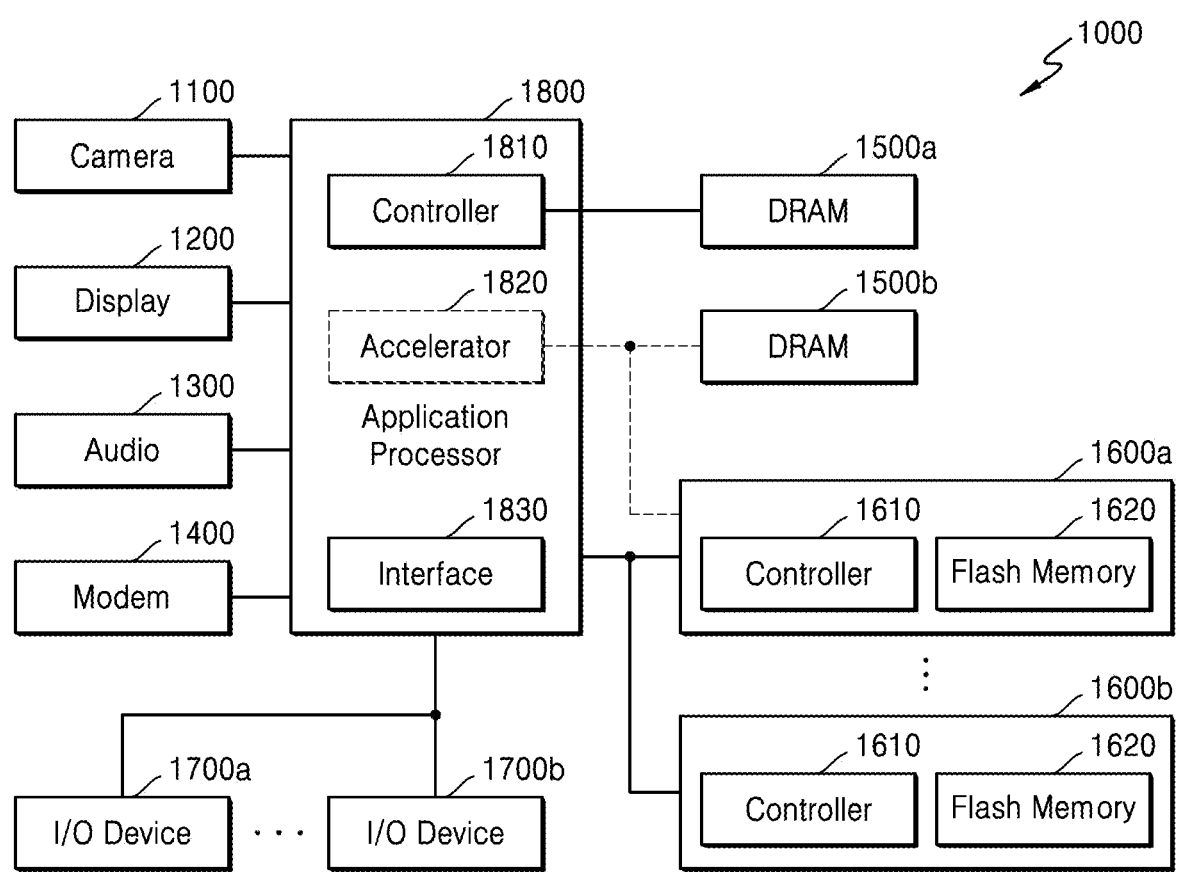
FIG. 12 is a block diagram of a system to which a receiver according to example embodiments of the inventive concepts is applied.

FIG. 12 is a block diagram of a system 1000 to which a receiver according to example embodiments of the inventive concepts is applied.

Referring to FIG. 12, the system 1000 may include a camera 1100, a display 1200, an audio processor 1300, a modem 1400, dynamic random access memories (DRAMs) 1500a and 1500b, flash memories 1600a and 1600b, input/output (I/O) devices 1700a and 1700b, and/or an application processor 1800 (hereinafter, referred to as "AP"). The system 1000 may be implemented as a laptop computer, a mobile phone, a smart phone, a tablet personal computer (PC), a wearable device, a healthcare device, or an Internet of things (JOT) device. In addition, the system 1000 may be implemented as a server or a personal computer.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The camera 1100 may capture a still image or a moving image according to a user's control, and may store captured image/image data or transmit it to the display 1200. The audio processor 1300 may process audio data included in the flash memories 1600a and 1600b or in content of a network. The modem 1400 may modulate signals to perform wired/wireless data transmission and reception and may demodulate the modulated signals to restore original signals at a receiving side. The I/O devices 1700a and 1700b may include devices that provide digital input and/or output functions, such as a universal serial bus (USB) or storage, a digital camera, a secure digital (SD) card, a digital versatile disc (DVD), a network adapter, and a touch screen.

The AP 1800 may control the overall operation of the system 1000. The AP 1800 may control the display 1200 such that a part of content stored in the flash memories 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. The DRAM 1500b may be additionally mounted on the accelerator block or the accelerator chip 1820. The accelerator block is a function block that specializes in performing a specific function of the AP 1800, and may include a graphic processing unit (GPU) that specializes in processing graphic data, a neural processing unit (NPU) that specializes in AI calculations and inference, and a data processing unit (DPU) that specializes in data transmission.

The system 1000 may include a plurality of DRAMs 1500a and 1500b. The AP 1800 may control the DRAMs 1500a and 1500b through command and mode register setting (MRS) conforming to the joint electron device engineering council (JEDEC) standard, or may set a DRAM interface protocol in order to use company-specific functions such as low voltage, high speed, and reliability, and cyclic redundancy check (CRC)/error correction code (ECC) functions. For example, the AP 1800 may communicate with the DRAM 1500a through an interface conforming to JEDEC standards such as low power double data rate 4 (LPDDR4) and LPDDR5, and the accelerator block or accelerator chip 1820 may set a new DRAM interface protocol to control the DRAM 1500b for accelerator, which has a higher bandwidth than the DRAM 1500a.

In FIG. 12, only the DRAMs 1500a and 1500b are illustrated. However, the inventive concepts are not limited thereto, and when the AP 1800 or the accelerator chip 1820 satisfies bandwidth, response speed, and voltage conditions, any memory such as phase-change memory (PRAM), static random access memory (SRAM), magnetic random access memory (MRAM), resistive random access memory (RRAM), ferroelectric random access memory (FRAM), or Hybrid RAM may be used. The DRAMs 1500a and 1500b may have a lower latency and bandwidth than the I/O devices 1700a and 1700b or the flash memories 1600a and 1600b. The DRAMs 1500a and 1500b may be initialized when the system 1000 is powered on. An operating system and application data may be loaded from outside of the system 1000, and the DRAMs 1500a and 1500b may be used as a temporary storage place for the operating system and application data, or may be used as an execution space for various software codes.

In the DRAMs 1500a and 1500b, add/subtract/multiply/divide operations, vector operations, address operations, or Fast Fourier Transform (FFT) operations may be performed. In addition, in the DRAMs 1500a and 1500b, a function that is used for inference may be performed. In some example embodiments, the inference may be performed in a deep learning algorithm using an artificial neural network. The deep learning algorithm may include a training operation of learning a model through various data and an inference operation of recognizing data with the learned model. As an example, an image captured by a user through the camera 1100 may be signal-processed and stored in the DRAM 1500b, and the accelerator block or accelerator chip 1820 may perform an AI data operation of recognizing data by using data stored in the DRAM 1500b and a function used for inference.

The system 1000 may include a plurality of storages or flash memories 1600a and 1600b having capacities greater than those of the DRAMs 1500a and 1500b. The accelerator block or the accelerator chip 1820 may perform a training operation and an AI data operation by using the flash memory devices 1600a and 1600b. In example embodiments, the flash memories 1600a and 1600b may efficiently perform a training operation and an inference AI data operation, which are performed by the AP 1800 and/or the accelerator chip 1820, by using a computing device provided in a memory controller 1610. The flash memories 1600a and 1600b may store pictures taken through the camera 1100 or may store data transmitted through a data network. For example, the flash memories 1600a and 1600b may store augmented reality (AR)/virtual reality (VR) content, and high definition (HD) or ultra-high definition (UHD) content.

The system 1000 may transmit or receive a CML level signal for high-speed operation between components. The camera 1100, the display 1200, the audio processor 1300, the modem 1400, the DRAMs 1500a and 1500b, the flash memories 1600a and 1600b, the I/O devices 1700a and 1700b, and/or the AP 1800 in the system 1000 may include one or more of the receiver circuits 200a to 200d described with reference to FIGS. 2 to 11.

While the inventive concepts have been particularly shown and described with reference to example embodiments thereof, it will be understood that various changes in form and details may be made therein without departing from the spirit and scope of the following claims.

What is claimed is:
1. A receiver comprising:
 a first circuit configured to receive an input signal, amplify a voltage difference between a voltage level of the input signal and a level of a reference voltage to generate first and second output signals, and output an internal signal, which is a digital signal corresponding to bits of the input signal, based on a voltage difference between the first output signal and the second output signal;
 a second circuit configured to receive the input signal, amplify the voltage difference between the voltage level of the input signal and the level of the reference voltage to generate third and fourth output signals, generate an average voltage level of the third output signal through a first switching element in response to a control signal to output the average voltage level of the third output signal as a first feedback signal, and generate an average voltage level of the fourth output signal through a second switching element in response to the control signal to output the average voltage level of the fourth output signal as a second feedback signal; and
 a control circuit configured to output the control signal of a pulse type whenever a logic level of the internal signal transitions, wherein the first and second switching elements are selectively turned on or off according to a logic pulse level of the control signal.

2. The receiver of claim 1, wherein the first circuit includes:
 a first amplifier circuit configured to amplify the voltage difference between the voltage level of the input signal and the level of the reference voltage to output the first output signal to a first node line and output the second output signal to a second node line;
 a second amplifier circuit configured to amplify a voltage difference between the first output signal and the second output signal to output fifth and sixth output signals, the second amplifier circuit being connected to the first node line and the second node line; and
 a level conversion circuit configured to amplify a first swing width of the fifth and sixth output signals to a second swing width greater than the first swing width and generate the internal signal.

3. The receiver of claim 1, wherein the second circuit includes:
 a first equalizer circuit configured to adjust a voltage level of the first output signal according to a voltage level of the first feedback signal and adjust a voltage level of the second output signal according to a voltage level of the second feedback signal; and
 a second equalizer circuit configured to amplify high frequency components of the first output signal and the second output signal,
 wherein the first equalizer circuit includes:
 an amplifier circuit configured to receive the input signal and amplify the voltage difference between the voltage level of the input signal and the level of the reference voltage to output the third output signal to a third node line and output the fourth output signal to a fourth node line;
 a first low pass filter configured to generate the average voltage level of the third output signal and output the average voltage level of the third output signal as the first feedback signal;
 a second low pass filter configured to generate the average voltage level of the fourth output signal and output the average voltage level of the fourth output signal as the second feedback signal;
 the first switching element configured to transmit or block the third output signal of the third node line to the first low pass filter in response to the control signal; and
 the second switching element configured to transmit or block the fourth output signal of the fourth node line to the second low pass filter in response to the control signal.

4. The receiver of claim 1, wherein the control circuit includes:
 first and second inverters connected in series to receive the internal signal;
 an exclusive OR gate that receives the internal signal and an output of the first and second inverters connected in series and outputs the control signal; and
 a third inverter that receives an output of the exclusive OR gate and outputs an inversion signal of the control signal.

5. The receiver of claim 4, wherein the first and second switching elements include transmission gates that are turned on or off in response to the control signal and the inversion signal of the control signal.

6. The receiver of claim 1, wherein the control circuit is further configured to generate the control signal having a logic level by which the first and second switching elements are turned on from an initial state of the receiver until the control signal having the logic pulse level is output.

7. The receiver of claim 6, wherein the control circuit includes:
- first and second inverters connected in series to receive the internal signal;
- an exclusive OR gate that receives the internal signal and an output of the first and second inverters connected in series;
- a flip-flop having a data input connected to a ground voltage line and a clock input connected to an internal signal line;
- an OR gate that receives an output of the exclusive OR gate and an output of the flip-flop and outputs the control signal; and
- a third inverter that receives an output of the OR gate and outputs an inversion signal of the control signal.

8. The receiver of claim 7, wherein the first and second switching elements include transmission gates that are turned on or off in response to the control signal and the inversion signal of the control signal.

9. A receiver comprising:
- a first circuit configured to receive an input signal, amplify a voltage difference between a voltage level of the input signal and a level of a reference voltage to generate first and second output signals, and output an internal signal, which is a digital signal corresponding to bits of the input signal, based on a voltage difference between the first output signal and the second output signal;
- a second circuit configured to receive the input signal, amplify the voltage difference between the voltage level of the input signal and the level of the reference voltage to generate third and fourth output signals, generate an average voltage level of the third output signal through a first switching element in response to a control signal to output the average voltage level of the third output signal as a first feedback signal, and generate an average voltage level of the fourth output signal through a second switching element in response to the control signal to output the average voltage level of the fourth output signal as a second feedback signal; and
- a control circuit configured to output the control signal of a pulse type or the control signal having a fixed logic level whenever a logic level of the internal signal transitions, based on a selection signal.

10. The receiver of claim 9, wherein the control circuit is further configured to control the first and second switching elements,
wherein the first and second switching elements are selectively turned on or off according to a logic pulse level of the control signal and turned on according to the fixed logic level of the control signal.

11. The receiver of claim 9, wherein the first circuit includes:
- a first amplifier circuit configured to amplify the voltage difference between the voltage level of the input signal and the level of the reference voltage to output the first output signal to a first node line and output the second output signal to a second node line;
- a second amplifier circuit configured to amplify a voltage difference between the first output signal and the second output signal to output fifth and sixth output signals, the second amplifier circuit being connected to the first node line and the second node line; and
- a level conversion circuit configured to amplify a first swing width of the fifth and sixth output signals to a second swing width greater than the first swing width and generate the internal signal.

12. The receiver of claim 9, wherein the second circuit includes:
- a first equalizer circuit configured to adjust a voltage level of the first output signal according to a voltage level of the first feedback signal and adjust a voltage level of the second output signal according to a voltage level of the second feedback signal; and
- a second equalizer circuit configured to amplify high frequency components of the first output signal and the second output signal,
wherein the first equalizer circuit includes:
- an amplifier circuit configured to receive the input signal and amplify the voltage difference between the voltage level of the input signal and the level of the reference voltage to output the third output signal to a third node line and output the fourth output signal to a fourth node line;
- a first low pass filter configured to generate the average voltage level of the third output signal and output the average voltage level of the third output signal as the first feedback signal;
- a second low pass filter configured to generate the average voltage level of the fourth output signal and output the average voltage level of the fourth output signal as the second feedback signal;
- the first switching element configured to transmit or block the third output signal of the third node line to the first low pass filter in response to the control signal; and
- the second switching element configured to transmit or block the fourth output signal of the fourth node line to the second low pass filter in response to the control signal.

13. The receiver of claim 9, wherein the control circuit includes:
- first and second inverters connected in series to receive the internal signal;
- an exclusive OR gate that receives the internal signal and an output of the first and second inverters connected in series;
- a multiplexer that has a first input connected to a power supply voltage line and a second input connected to a ground voltage line, outputs a power supply voltage level of the first input in response to a first logic level of the selection signal, and outputs a ground voltage level of the second input in response to a second logic level of the selection signal;
- a flip-flop having a data input connected to an output line of the multiplexer and a clock input connected to an internal signal line; and
- a NOR gate that receives an output of the exclusive OR gate and an output of the flip-flop and outputs the control signal.

14. The receiver of claim 13, wherein the first and second switching elements include P-type metal oxide semiconductor transistors that are turned on or off in response to the control signal.

15. The receiver of claim 9, wherein the selection signal is provided from a mode register set of a memory device including the receiver.

16. The receiver of claim 9, wherein the selection signal is provided from outside of a semiconductor device including the receiver.

17. A receiver for receiving an input signal and outputting an internal signal that is a digital signal corresponding to bits of the input signal, the receiver comprising:
a first amplifier circuit configured to amplify a voltage difference between a voltage level of the input signal and a level of a reference voltage to output a first output signal to a first node line and output a second output signal to a second node line;
a second amplifier circuit configured to amplify a voltage difference between the first output signal and the second output signal to output fifth and sixth output signals, the second amplifier circuit being connected to the first node line and the second node line;
a level conversion circuit configured to amplify a first swing width of the fifth and sixth output signals to a second swing width greater than the first swing width and generate the internal signal;
a first equalizer circuit configured to receive the input signal, amplify the voltage difference between the voltage level of the input signal and the level of the reference voltage to generate third and fourth output signals, generate an average voltage level of the third output signal through a first switching element in response to a control signal to output the average voltage level of the third output signal as a first feedback signal, generate an average voltage level of the fourth output signal through a second switching element in response to the control signal to output the average voltage level of the fourth output signal as a second feedback signal, and adjust the voltage difference between the first output signal and the second output signal based on a voltage difference between the first feedback signal and the second feedback signal; and
a control circuit configured to output the control signal of a pulse type whenever a logic level of the internal signal transitions, wherein the first and second switching elements are selectively turned on or off according to a logic pulse level of the control signal.

18. The receiver of claim 17, wherein the first amplifier circuit includes:
a first transistor having a gate terminal connected to an input signal line and a source terminal connected to a current source connected to a power supply voltage line;
a second transistor having a gate terminal connected to a reference voltage line and a source terminal connected to the current source;
a first resistor connected between a drain terminal of the first transistor and a ground voltage line; and
a second resistor connected between a drain terminal of the second transistor and the ground voltage line,
wherein the first and second transistors include PMOS transistors, the first output signal is output from a first connection node between the drain terminal of the second transistor and the second resistor, and the second output signal is output from a second connection node between the drain terminal of the first transistor and the first resistor.

19. The receiver of claim 17, wherein the second amplifier circuit includes:
a first transistor having a gate terminal connected to a first output signal line and a source terminal connected to a current source connected to a power supply voltage line;
a second transistor having a gate terminal connected to a reference voltage line and a source terminal connected to the current source;
a first resistor connected between a drain terminal of the first transistor and a ground voltage line; and
a second resistor connected between a drain terminal of the second transistor and the ground voltage line,
wherein the first and second transistors include PMOS transistors, the fifth output signal is output from a connection node between the drain terminal of the second transistor and the second resistor, and the sixth output signal is output from a connection node between the drain terminal of the first transistor and the first resistor.

20. The receiver of claim 17, wherein the first equalizer circuit includes:
a first transistor having a gate terminal connected to an input signal line, a source terminal connected to a current source connected to a power supply voltage line, and a drain terminal connected to a fourth output signal line;
a second transistor having a gate terminal connected to a reference voltage line, a source terminal connected to the current source, and a drain terminal connected to a third output signal line;
a first resistor connected between the drain terminal of the first transistor and a ground voltage line;
a second resistor connected between the drain terminal of the second transistor and the ground voltage line;
a first low pass filter configured to generate the average voltage level of the third output signal and output the average voltage level of the third output signal as the first feedback signal;
a second low pass filter configured to generate the average voltage level of the fourth output signal and output the average voltage level of the fourth output signal as the second feedback signal;
the first switching element configured to transmit or block the third output signal to the first low pass filter in response to the control signal; and
the second switching element configured to transmit or block the fourth output signal to the second low pass filter in response to the control signal.

* * * * *